(12) United States Patent
Xiao et al.

(10) Patent No.: US 11,800,710 B2
(45) Date of Patent: *Oct. 24, 2023

(54) THREE-DIMENSIONAL MEMORY DEVICES AND FABRICATING METHODS THEREOF

(71) Applicant: Yangtze Memory Technologies Co., Ltd., Hubei (CN)

(72) Inventors: Li Hong Xiao, Hubei (CN); Zongliang Huo, Hubei (CN)

(73) Assignee: Yangtze Memory Technologies Co., Ltd., Hubei (CN)

( * ) Notice: Subject to any disclaimer, the term of this patent is extended or adjusted under 35 U.S.C. 154(b) by 211 days.

This patent is subject to a terminal disclaimer.

(21) Appl. No.: 17/175,203

(22) Filed: Feb. 12, 2021

(65) Prior Publication Data
US 2021/0167088 A1   Jun. 3, 2021

Related U.S. Application Data

(63) Continuation of application No. 16/239,134, filed on Jan. 3, 2019, now Pat. No. 11,031,413, which is a
(Continued)

(51) Int. Cl.
*H01L 21/76* (2006.01)
*H10B 43/27* (2023.01)
(Continued)

(52) U.S. Cl.
CPC ....... *H10B 43/27* (2023.02); *H01L 21/76224* (2013.01); *H01L 21/76877* (2013.01);
(Continued)

(58) Field of Classification Search
CPC ......... H01L 27/11582; H01L 27/11568; H01L 21/76224; H01L 21/76877; H01L 23/481;
(Continued)

(56) References Cited

U.S. PATENT DOCUMENTS 9,224,747 B2 * 12/2015 Mizutani .......... H01L 27/11524
10,199,326 B1 * 2/2019 Ohsaki ............. H01L 21/76898
(Continued)

FOREIGN PATENT DOCUMENTS

CN   104241294 A   12/2014
CN   105097706 A   11/2015
(Continued)

OTHER PUBLICATIONS

International Search Report and Written Opinion of the International Searching Authority directed to related International Patent Application No. PCT/CN2018/119933, dated Aug. 27, 2019; 7 pages.

*Primary Examiner* — S M Sohel Imtiaz
(74) *Attorney, Agent, or Firm* — Sterne, Kessler, Goldstein & Fox P.L.L.C.

(57) ABSTRACT

A method for forming a gate structure of a 3D memory device is provided. The method comprises: forming a plurality of hybrid shallow trench isolation structures in a substrate, each hybrid shallow trench isolation structure comprising a dielectric sublayer and a conductive sublayer, both of which are embedded in the substrate; forming an alternating dielectric stack on the substrate; forming a slit penetrating vertically through the alternating dielectric stack and extending in a horizontal direction to expose a row of hybrid shallow trench isolation structures; forming a plurality of array common source contacts in the slit, each array common source contact being in electric contact with a corresponding hybrid shallow trench isolation structure.

20 Claims, 16 Drawing Sheets

Related U.S. Application Data continuation of application No. PCT/CN2018/119933, filed on Dec. 7, 2018.

(51) Int. Cl.
*H01L 21/762* (2006.01)
*H01L 21/768* (2006.01)
*H01L 23/48* (2006.01)
*H01L 23/522* (2006.01)
*H10B 43/30* (2023.01)
*H10B 43/40* (2023.01)

(52) U.S. Cl.
CPC ........ *H01L 23/481* (2013.01); *H01L 23/5226* (2013.01); *H10B 43/30* (2023.02); *H10B 43/40* (2023.02); *H01L 21/76802* (2013.01); *H01L 21/76898* (2013.01)

(58) Field of Classification Search
CPC ........... H01L 23/5226; H01L 27/11573; H01L 21/76802; H01L 21/76898; H01L 27/11565; H01L 27/11575; H01L 27/11548; H01L 27/1155; H10B 43/27; H10B 43/30; H10B 43/40
See application file for complete search history.

(56) References Cited

U.S. PATENT DOCUMENTS

| | | | |
|---|---|---|---|
| 2015/0055413 A1* | 2/2015 | Alsmeier | H01L 27/1157 438/106 |
| 2015/0179660 A1* | 6/2015 | Yada | H01L 27/11556 257/314 |
| 2016/0141298 A1* | 5/2016 | Chuang | H01L 21/76229 438/424 |
| 2016/0181270 A1* | 6/2016 | Lee | H01L 27/11578 257/314 |
| 2016/0307908 A1* | 10/2016 | Sharangpani | H01L 27/1157 |
| 2017/0062456 A1* | 3/2017 | Sugino | H01L 27/1157 |
| 2020/0091170 A1* | 3/2020 | Baek | H01L 21/0217 |
| 2020/0185407 A1 | 6/2020 | Xiao et al. | |

FOREIGN PATENT DOCUMENTS

| | | |
|---|---|---|
| CN | 105990251 A | 10/2016 |
| CN | 106847820 A | 6/2017 |
| CN | 107431071 A | 12/2017 |
| CN | 108878437 A | 11/2018 |
| CN | 109690775 A | 4/2019 |

* cited by examiner

THREE-DIMENSIONAL MEMORY DEVICES AND FABRICATING METHODS THEREOF

CROSS-REFERENCE TO RELATED APPLICATIONS

This application is a continuation application of U.S. patent application Ser. No. 16/239,134, filed on Jan. 3, 2019, which is a continuation application of International Application No. PCT/CN2018/119933, filed on Dec. 7, 2018, which are incorporated herein by reference in their entireties.

BACKGROUND

Embodiments of the present disclosure relate to three-dimensional (3D) memory devices and fabrication methods thereof.

Planar memory cells are scaled to smaller sizes by improving process technology, circuit designs, programming algorithms, and fabrication processes. However, as feature sizes of the memory cells approach a lower limit, planar processes and fabrication techniques become challenging and costly. As a result, memory density for planar memory cells approaches an upper limit.

A 3D memory architecture can address the upper density limitation in planar memory cells. The 3D memory architecture includes a memory array and peripheral devices for controlling signals to and from the memory array.

BRIEF SUMMARY

Embodiments of method for forming gate structures of 3D memory devices and fabrication methods thereof are disclosed herein.

Disclosed is a method for forming a three-dimensional (3D) NAND memory device, comprising: forming a plurality of hybrid shallow trench isolation structures in a substrate; forming an alternating dielectric stack on the substrate, the alternating dielectric stack including a plurality of dielectric layer pairs each comprising a first dielectric layer and a second dielectric layer different from the first dielectric layer, forming a plurality of channel structures in the alternating dielectric stack; forming a slit penetrating vertically through the alternating dielectric stack and extending in a horizontal direction to divide the plurality of channel structures and to expose a row of hybrid shallow trench isolation structures, replacing the second dielectric layers in the alternating dielectric stack with a plurality of gate structures through the slit; forming a spacer wall to fill the slit; and forming a plurality of array common source contacts each in electric contact with a corresponding hybrid shallow trench isolation structure.

In some embodiments, forming the plurality of hybrid shallow trench isolation structures comprises forming at least one row of shallow trenches extending in the horizontal direction in the substrate; and forming the plurality of hybrid shallow trench isolation structures in the at least one row of shallow trenches.

In some embodiments, forming the plurality of hybrid shallow trench isolation structures comprises: forming a dielectric sublayer in the at least one row of shallow trenches; removing an upper portion of the dielectric sublayer; and forming a conductive sublayer on a remaining portion of the dielectric sublayer.

In some embodiments, forming the plurality of hybrid shallow trench isolation structures comprises forming the plurality of hybrid shallow trench isolation structures arranged in an array, the array including a plurality rows of hybrid shallow trench isolation structures extending paralleling in the horizontal direction.

In some embodiments, forming the silt comprises forming a plurality of silts each expose a corresponding row of shallow trench isolation structures.

In some embodiments, forming the plurality of channel structures comprises: forming a channel hole extending vertically through the alternating dielectric stack; forming an epitaxial layer in a bottom portion of the channel hole; forming a functional layer on a sidewall of the channel hole; forming a channel layer covering a sidewall of the functional layer; forming a filling structure to fill the channel hole; and forming a channel plug in a top portion of the channel hole.

In some embodiments, forming the functional layer comprises: forming a barrier layer on a sidewall of the channel hole configured to block an outflow of electronic charges during operation; forming a storage layer on a surface of the barrier layer configured to store electronic charges during operation; and forming a tunneling layer on a surface of the storage layer configured to tunnel electronic charges during operation.

In some embodiments, forming the plurality of array common source contacts comprising: forming a plurality of through holes vertically penetrating the spacer wall, each expose the conductive sublayer of a corresponding shallow trench isolation structure; and forming the plurality of array common source contacts in the plurality of through holes respectively, each array common source contact being in electrical contact with the conductive sublayer of the corresponding shallow trench isolation structure.

In some embodiments, the method further comprises: forming a staircase structure including a plurality of staircases each comprising a conductive surface; and forming a plurality of word line contacts simultaneously with the formation of the plurality of array common source contacts, each word line contacts being in electrical contact with the conductive surface of a corresponding staircase.

In some embodiments, the method further comprises: forming a transistor of a peripheral device in the substrate; and forming a peripheral contact simultaneously with the formation of the plurality of array common source contacts, the peripheral contact being in electrical contact with the transistor.

In some embodiments, forming the plurality of array common source contacts comprises: forming a plurality of via holes each vertically penetrating the substrate and the dielectric sublayer of a corresponding shallow trench isolation structure; and forming the plurality of array common source contacts in the plurality of via holes respectively, each array common source contact being in electrical contact with the conductive sublayer of the corresponding shallow trench isolation structure.

Another aspect of the present disclosure provides a three-dimensional (3D) NAND memory device, comprising: a substrate including a plurality of hybrid shallow trench isolation structures; an alternating dielectric/conductive stack including a plurality of dielectric/conductive layer pairs on a substrate, each of the plurality of dielectric/conductive layer pairs comprising a dielectric layer and a conductive layer; a plurality of channel structures vertically penetrating the alternating dielectric/conductive stack; a slit penetrating vertically through the alternating dielectric/conductive stack and extending between the plurality of channel structures in a horizontal direction a spacer wall in the slit;

and a plurality of array common source contacts each in electric contact with a corresponding hybrid shallow trench isolation structure.

In some embodiments, each hybrid shallow trench isolation structure comprises a dielectric sublayer and a conductive sublayer; and each array common source contact is in electrical contact with the conductive sublayer of the corresponding shallow trench isolation structure.

In some embodiments, the plurality of hybrid shallow trench isolation structures are arranged in an array, the array including a plurality rows of hybrid shallow trench isolation structures extending paralleling in the horizontal direction; and the plurality of array common source contacts are arranged in the array, each array common source contact being in electric contact with a corresponding hybrid shallow trench isolation structure.

In some embodiments, the plurality of channel structures comprises: a channel hole extending vertically through the alternating dielectric/conductive stack; an epitaxial layer in a bottom portion of the channel hole a functional layer on a sidewall of the channel hole; a channel layer covering a sidewall of the functional layer; a filling structure filling the channel hole; and a channel plug in a top portion of the channel hole.

In some embodiments, the functional layer comprises: a barrier layer on a sidewall of the channel hole configured to block an outflow of electronic charges during operation; a storage layer on a surface of the barrier layer configured to store electronic charges during operation; and a tunneling layer on a surface of the storage layer configured to tunnel electronic charges during operation.

In some embodiments, the plurality of array common source contacts are vertically penetrating the spacer wall.

In some embodiments, the device further comprises: a staircase structure including a plurality of staircases each comprising a conductive surface; and a plurality of word line contacts each being in electrical contact with the conductive surface of a corresponding staircase; wherein the plurality of word line contacts and the plurality of array common source contacts are formed simultaneously in a single process.

In some embodiments, the device further comprises: a transistor of a peripheral device in the substrate; and a peripheral contact being in electrical contact with the transistor; wherein the peripheral contact and the plurality of array common source contacts are formed simultaneously in a single process.

In some embodiments, each of the plurality of array common source contacts is vertically penetrating the substrate and the dielectric sublayer of a corresponding shallow trench isolation structure.

Other aspects of the present disclosure can be understood by those skilled in the art in light of the description, the claims, and the drawings of the present disclosure.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

Figure 1:
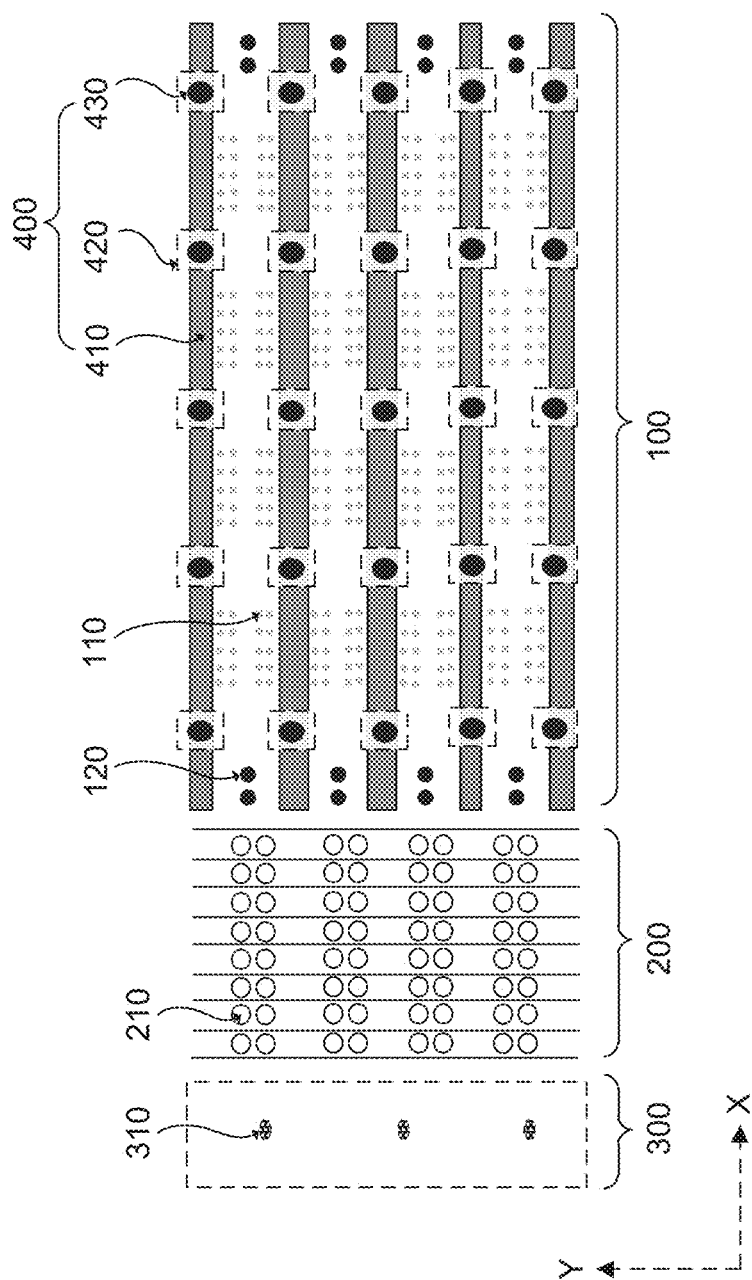
FIG. 1 illustrates a schematic perspective plan of an exemplary 3D memory device, according to some embodiments of the present disclosure.

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to effect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a." "an," or "the," again, may be understood to convey a singular usage or to convey a plural usage, depending at least in part upon context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure, or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnection layer can include one or more conductor and contact layers (in which contacts, interconnect lines, and/or vias are formed) and one or more dielectric layers.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., 10%, 20%, or 30% of the value).

As used herein, the term "3D memory device" refers to a semiconductor device with vertically-oriented strings of memory cell transistors (i.e., region herein as "memory strings," such as NAND strings) on a laterally-oriented substrate so that the memory strings extend in the vertical direction with respect to the substrate. As used herein, the term "vertical/vertically" means nominally perpendicular to a lateral surface of a substrate.

Generally, in some conventional methods for forming the 3D memory devices, an epitaxial layer is formed at a bottom of each channel hole by using silicon selective epitaxial growth (SEG) technique. However, the SEG process may cause various problems, e.g., a difficult trade-off between a good channel hole etch profile and a good SEG growth profile, an unstable electrical connection between the epitaxial layer and the channel layer, an undesired sensitivity of the epitaxial layer to channel and/or dummy channel pattern loading, etc. Further, in order to electrically connecting the channel layer to the epitaxial layer, a punching etching is performed to the bottom of each channel hole which induces damages to the sidewall of the functional layer and the channel layer. For two-deck or multiple-deck 3D memory devices, the punching etching can induce more damage hence requires tighter (e.g. less than 8 nm) upper-to-lower deck overlay.

On the other hand, in a 3D memory device formed by a conventional SEG-free process, the channel layer at the source end is only connected to the buried N+ polysilicon source line, which can cause the majority-carrier hole Fowler Nordheim Tunneling (FN) erase operations no longer workable. Thus, the gate-induced drain leakage current (GIDL) induced hole erase operations are required, which means the speed of the erase operation is much slower, especially for two-deck or multiple-deck 3D memory devices with a larger number of word-lines.

Accordingly, a method for forming a 3D memory device is provided. Instead of using a heavily doped/implanted crystalline silicon region as an array common source (ACS), the disclosed method forms the ACS in a hybrid structure with conductive and dielectric materials. Such design can scientifically reduce the contact resistance between the ACS and the ACS contact. Further, the 3D memory device formed by the disclosed method can have a better control of carriers between the source and the drain.

FIG. 1 illustrates a schematic perspective plan view of an exemplary 3D memory device, according to some embodiments of the present disclosure. As shown, the 3D memory device can include a core array region 100, one or more staircase regions 200 disposed on the sides of the core array region 100, and one or more periphery regions 300 disposed outside of the staircase regions 200. It is noted that, FIG. 1 illustrates merely one staircase region 200 and one periphery region 300 for simplicity, and additional staircase regions 200 and periphery regions 300 can be disposed on other sides of the core array region 100.

In the core array region 100, multiple NAND strings 110 can be arranged in an array form. Each NAND string 110 can include a plurality of memory cells stacked in a vertical direction (i.e., the direction perpendicular to the X-Y plane). In the staircase region 200, multiple word line contact 210 can extend in the vertical direction, such that the lower end of each word line contact 210 can be in electrical contact with a top conductor layer (word line) in a respective level of a staircase structure in the staircase region 200. In the periphery region 300, multiple periphery contacts 310 can extend in the vertical direction, such that the lower end of each periphery contact 310 can be in electrical contact with a corresponding transistor of a periphery device in the periphery region 300.

As shown in FIG. 1, multiple silts structures 400 can each extend laterally in the X direction (e.g., the word line direction). The slit structures 400 can divide the core array region 100 into multiple memory blocks and/or multiple memory fingers. In some embodiments, each slit structure 400 can include a spacer wall 410, multiple shallow trench isolation (STI) structures 420 beneath the spacer wall 410, and multiple array common source (ACS) contacts 430 that vertically penetrate the spacer wall 410 and be in electrical contact with the shallow trench isolation (STI) structures 420 respectively. The multiple ACS contacts 430 can function as the common source contacts for an array of NAND strings 110 in the core array region 100.

It is noted that, although the shallow trench isolation (STI) structures 420 are illustrated as a square shape in FIG. 1, the actually pattern layout and design critical dimension of the shallow trench isolation (STI) structures 420 can be any suitable shape that is proper for dielectric fillings and the ACS contacts 430 to land on, e.g. a rounded shape, an elliptical shape, a rectangular shape, a quadrant shape, a polygonal shape, an irregularly shape, etc.

Multiple dummy channel structures 120 can be disposed in the core array region 100, the staircase region 200, and/or the periphery region 300 to provide mechanical support for the 3D memory array structures. It is understood that dummy channel structures 120 can be arranged in any suitable positions in the core array region 100, the staircase region 200, and/or the periphery region 300.

Figure 2:
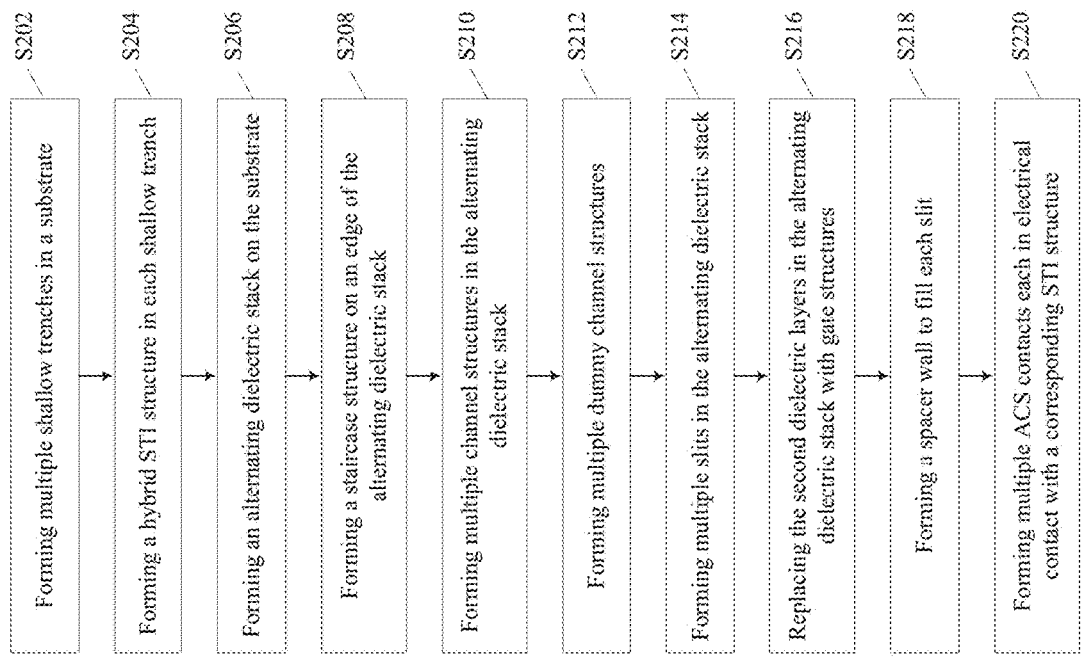
FIG. 2 illustrates a flow diagram of an exemplary method for forming a 3D memory device, according to some embodiments of the present disclosure.

FIG. 2 illustrates a flow diagram of an exemplary method for forming a 3D memory device, according to some embodiments of the present disclosure. FIGS. 3-16 illustrate schematic cross-sectional views of an exemplary 3D memory device at certain fabricating stages of the method shown in FIG. 2 according to some embodiments of the present disclosure.

As shown in FIG. 2, the method starts at operation S202, in which multiple shallow trenches can be formed in a substrate. In some embodiments, the substrate can be any suitable semiconductor substrate having any suitable structure, such as a monocrystalline single-layer substrate, a polycrystalline silicon (polysilicon) single-layer substrate, a polysilicon and metal multi-layer substrate, etc.

Figure 3:
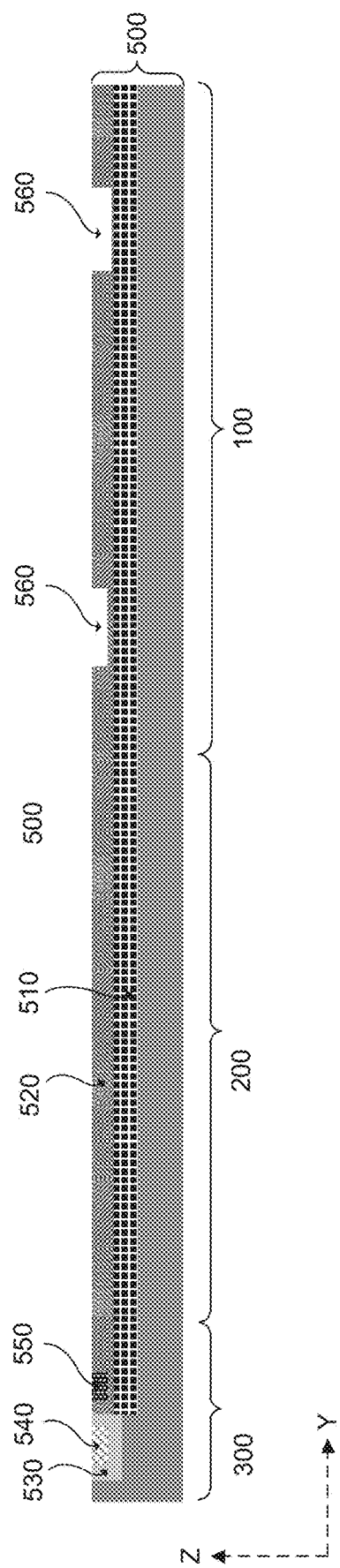
FIGS. 3-16 illustrate schematic cross-sectional views of an exemplary 3D memory device at certain fabricating stages of the method shown in FIG. 2 according to some embodiments of the present disclosure.

In accordance with some embodiments, as shown in FIG. 3, the substrate 500 can be a polysilicon substrate. Multiple well regions and/or doped regions can be form in the substrate 500. For example, as shown in FIG. 3, a deep n-well region 510, a high-voltage p-well (HVPW) region 520, a high-voltage n-well (HVNW) region 530, a heavily doped n (N+) region 540, and a heavily doped p (P+) region 550 can be formed in the substrate 500. In some embodiments, the HVNW region 530, the N+ region 540, and P+ region 550 can be located in the periphery region 300 for forming a transistor of the periphery device of the 3D memory device.

As shown in FIG. 3, multiple shallow trenches 560 can be formed in the HVPW region 520. The multiple shallow trenches 560 can be located in the core array region 100, and arranged in an array from. Specifically, the connecting line of each row of the shallow trenches 560 can extend along the X direction and correspond to a slit (not shown in FIG. 3) formed in a subsequent process. The multiple shallow trenches 560 can be formed by any suitable shallow trench isolation (STI) etching process, such as a wet etching, a dry etching, or a combination thereof. Each shallow trench 560 in the lateral X-Y plane can have any suitable shape, such as a rounded shape, an elliptical shape, a rectangular shape, a quadrant shape, a polygonal shape, an irregularly shape, etc. In some embodiments, a depth of the shallow trenches 560 can be in a range from about 100 nm to 1000 nm.

Figure 4:
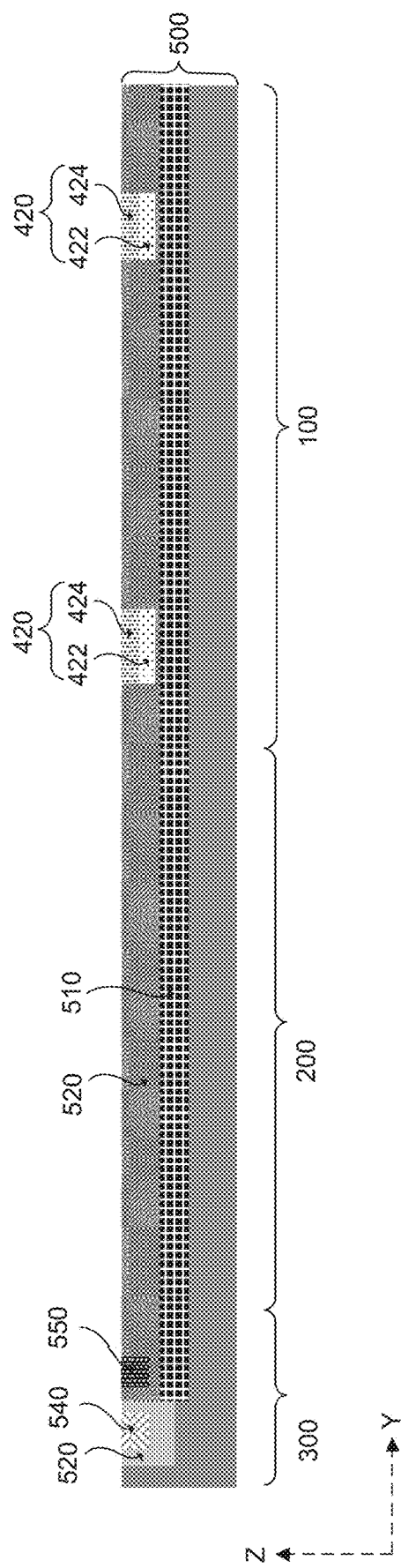

As shown in FIG. 2, the method proceeds to operation S204, in which a hybrid shallow trench isolation (STI) structure can be formed in each of the multiple shallow trenches. As shown in FIG. 4, each hybrid STI structure 420 can include a dielectric sublayer 422, and a conductive sublayer 424 above the dielectric sublayer 422.

The dielectric sublayer 422 can include any suitable dielectric materials that provide electric insulating function. For example, the dielectric sublayer 422 can include one or more from silicon based dielectric materials, such as silicon oxide ($SiO_2$), silicon nitride ($Si_3N_4$) silicon oxynitride (SiON), silicon carbide (SiC), etc., and/or high k-value dielectric materials, such as aluminum oxide ($Al_2O_3$), hafnium dioxide ($HfO_2$), Tantalum pentoxide ($Ta_2O_5$), titanium nitride (TiN), etc., and/or any suitable combinations thereof. In some embodiments, the dielectric sublayer 422 can be a single film, or include multiple films each having different materials.

The conductive sublayer 424 can include any suitable conductive materials that provide electrical conduction function. For example, the conductive sublayer 424 can include one or more from metals and/or alloys, such as titanium with titanium nitride (Ti/TiN), tungsten (W), copper (Cu), cobalt (Co), nickel (Ni), aluminum (Al), gold (Au), etc., and/or silicide, such as titanium silicide (TiSi), tungsten silicide (WSi), cobalt silicide (CoSi), nickel silicide (NiSi), etc., and/or any suitable combinations thereof. In some embodiments, the conductive sublayer 424 can be a single film or include multiple films each having different materials.

In some embodiments, the fabricating process for forming the hybrid STI structures 420 can include filling the multiple shallow trenches 560 with one or more dielectric materials by using one or more thin film deposition processes including, but not limited to, Chemical Vapor Deposition (CVD), Physical Vapor Deposition (PVD), Atomic Layer Deposition (ALD), or any combination thereof. Optionally, a chemical mechanical polish (CMP) process can be performed to remove the one or more dielectric materials outside of the multiple shallow trenches 560. The fabricating process for forming the hybrid STI structures 420 can further include a recess etching process to remove an upper portion of the one or more dielectric materials filled in the multiple shallow trenches 560 to form the dielectric sublayer 422 that locates in a lower portion of each shallow trench 560. In some embodiments, a thickness range of the dielectric sublayer 422 can be in a range from about 10 nm to 500 nm.

Then, the upper portions of the multiple shallow trenches 560 can be filled with one or more conductive materials by using one or more thin film deposition processes including, but not limited to, CVD, PVD, ALD, or any combination thereof. A following CMP process can be performed to remove the one or more conductive materials outside of the multiple shallow trenches 560 to form the conductive sublayer 424. An upper surface of the conductive sublayer 424 in each shallow trench 560 can be coplanar with the upper surface of the HVPW region 520. In some embodiments, a thickness range of the conductive sublayer 424 can be in a range from about 10 nm to 500 nm.

As shown in FIG. 2, the method proceeds to operation S206, in which an alternating dielectric stack is formed on the substrate.

Figure 5:
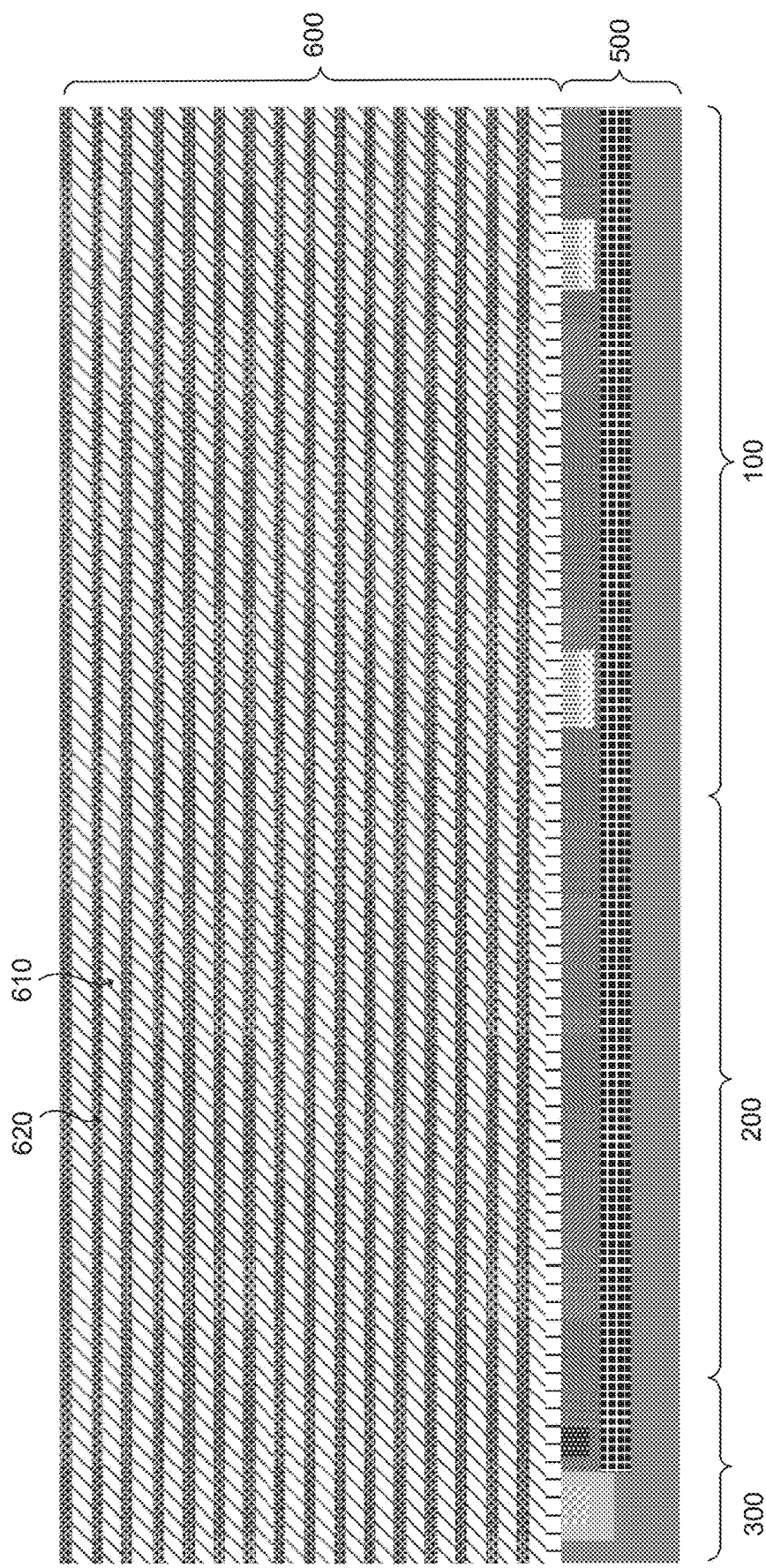

As shown in FIG. 5, an alternating dielectric stack 600 including a plurality of dielectric layer pairs can be formed on the substrate 500. Each dielectric layer pairs of the alternating dielectric stack 600 can include an alternating stack of a first dielectric layer 610 and a second dielectric layer 620 that is different from first dielectric layer 610. In some embodiments, the first dielectric layers 610 can be used as insulating layers, and the second dielectric layer 620 can be used as sacrificial layers, which are to be removed in the subsequent processes.

The plurality of first dielectric layers 610 and second dielectric layers 620 are extended in a lateral direction that is parallel to a surface of the substrate 500. In some embodiments, there are more layers than the dielectric layer pairs made of different materials and with different thicknesses in the alternating dielectric stack 600. The alternating dielectric stack 600 can be formed by one or more thin film deposition processes including, but not limited to, CVD, PVD, ALD, or any combination thereof.

In some embodiments, the alternating dielectric stack 600 can include a plurality of oxide/nitride layer pairs. Each dielectric layer pair includes a layer of silicon oxide 610 and a layer of silicon nitride 620. The plurality of oxide/nitride layer pairs are also referred to herein as an "alternating oxide/nitride stack." That is, in the alternating dielectric stack 600, multiple oxide layers 610 and multiple nitride layers 620 alternate in a vertical direction. In other words, except a top and a bottom layer of a given alternating oxide/nitride stack, each of the other oxide layers 610 can be sandwiched by two adjacent nitride layers 620, and each of the nitride layers 620 can be sandwiched by two adjacent oxide layers 610.

Oxide layers 610 can each have the same thickness or have different thicknesses. For example, a thickness of each oxide layer can be in a range from about 1 nm to about 150 nm. Similarly, nitride layers 620 can each have the same thickness or have different thicknesses. For example, a thickness of each nitride layer can be in a range from about 10 nm to about 150 nm. In some embodiments, a total thickness of the alternating dielectric stack 600 can be larger than 1000 nm. It is noted that, the thickness ranges are provided for illustration, and should not be construed to limit the scope of the appended claims.

It is noted that, in the present disclosure, the oxide layers 610 and/or nitride layers 620 can include any suitable oxide materials and/or nitride materials. For example, the element of the oxide materials and/or nitride materials can include, but not limited to, tungsten (W), cobalt (Co), copper (Cu), aluminum (Al), doped silicon, silicides, or any combination thereof. In some embodiments, the oxide layers can be silicon oxide layers, and the nitride layers can be silicon nitride layer.

The alternating dielectric stack 600 can include any suitable number of layers of the oxide layers 610 and the nitride layers 620. In some embodiments, a total number of layers of the oxide layers 610 and the nitride layers 620 in the alternating dielectric stack 600 is equal to or larger than 64. That is, a number of oxide/nitride layer pairs can be equal to or larger than 32. In some embodiments, alternating oxide/nitride stack includes more oxide layers or more nitride layers with different materials and/or thicknesses than the oxide/nitride layer pair. For example, a bottom layer and a top layer in the alternating dielectric stack 600 can be oxide layers 610.

As shown in FIG. 2, the method proceeds to operation S208, in which the alternating dielectric stack in the periphery region can be completely removed, and portions of the alternating dielectric stack in the staircase region can be removed to form a staircase structure. An insulating layer can be formed in the periphery region and the staircase region to cover the staircase structure.

Figure 6:
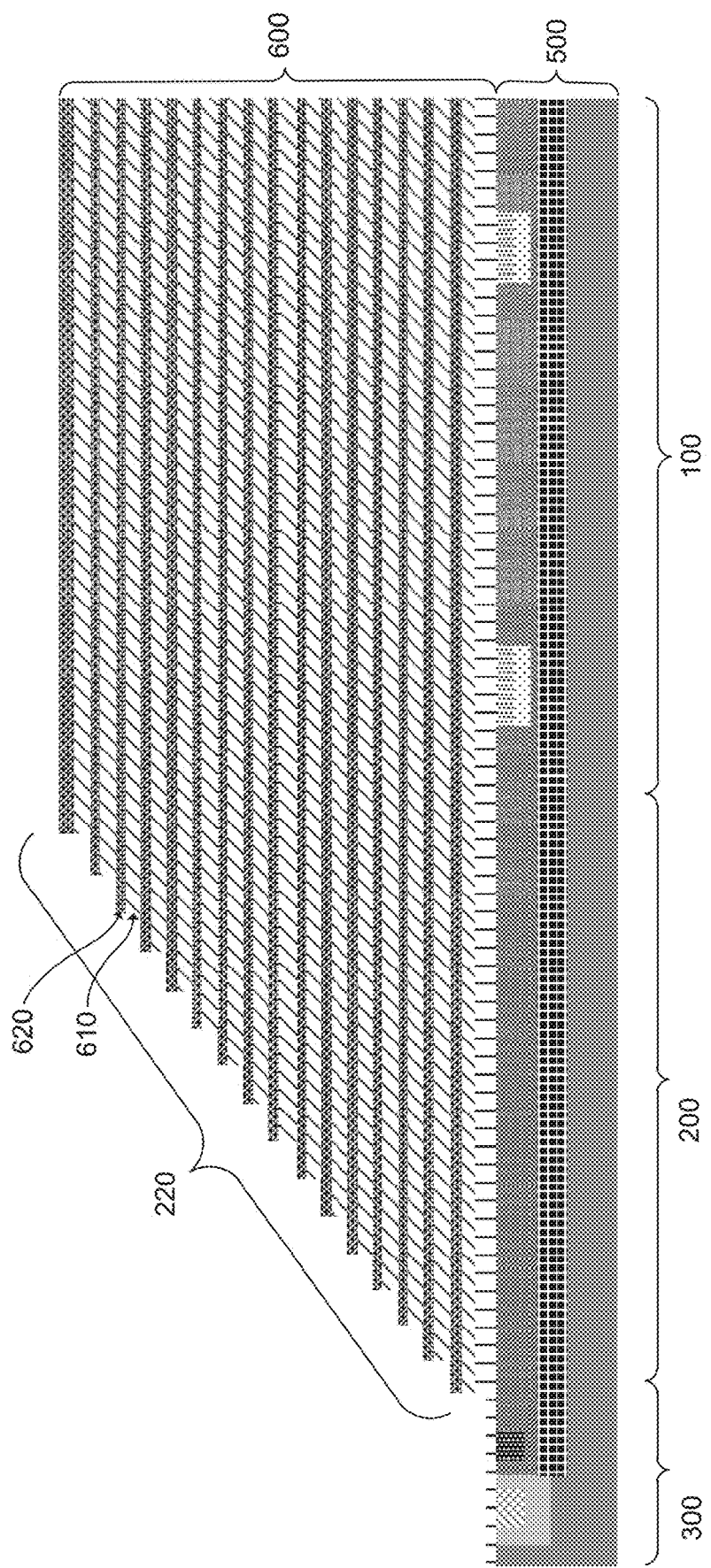

As shown in FIG. 6, portions of the alternating dielectric stack 600 can be removed to form a staircase structure 220 in the staircase region 200. In some embodiments, the alternating dielectric stack 600 in the peripheral region 300 can be completely removed. Multiple etch-trim processes can be performed repeatedly to form a set of steps. In some embodiments, each step can include one or more dielectric layer pairs. As such, each step can expose a portion of the top surface of one second dielectric layer 620.

In some embodiments, the etch-trim processes can include a set of repeating etch-trim processes to form the staircase structure 220 including a set of steps at the edge the alternating dielectric stack 600.

Specifically, for forming each step, a photoresist layer (not shown) can be used as a mask to expose a portion of the top surface of the alternating dielectric stack 600. For forming the first step, a width of the exposed top surface of the alternating dielectric stack 600 can be a step width. In some embodiments, an anisotropic etching process, such as a reactive ion etching (RIE) process, or other suitable dry/wet etching process, can be performed to remove the exposed layer (e.g., the second dielectric layer 620) that is exposed through the mask (i.e., the photoresist layer). The etching process can stop on the next lower layer (e.g . . . the + first dielectric layer 610). The pattern in the mask (i.e., the photoresist layer) is then transferred to the layer (e.g., the second dielectric layer 620) that has been etched. The exposed next lower layers (e.g., the first dielectric layers 610) can be then removed by another etching process that stops on the next lower layers (e.g., the second dielectric layer 620). As such, the first step can be created on the first two top layers of the alternating dielectric stack 600.

Next, the mask (i.e., the photoresist layer) can be reduced in size by removing a portion of the mask (also known as "trimming") above the alternating dielectric stack 600, such as by an isotropic etching process, to expose another step width of the alternating dielectric stack 600. The method can proceed by subjecting the structure to two anisotropic etching processes, including removing exposed portions of the two exposed layers (e.g., two second dielectric layers 620), and subsequently removing exposed portions of the two exposed next lower layers (e.g., the first dielectric layers 610). As such, the first step can be lowered to the third and fourth top layers of the alternating dielectric stack 600, and a second step can be created on the first two top layers of the alternating dielectric stack 600.

In some embodiments, the successive reduction in size of the mask (i.e., the photoresist layer) and the two-step etching processes (also referred as etch-trim processes) can be repeated such that the staircase structure 220 including a set of steps can be formed in the staircase region 20, as shown in FIG. 6. The photoresist layer can be then removed. In some embodiments, the removal process can include any suitable etching processes and cleaning processes.

Figure 7:
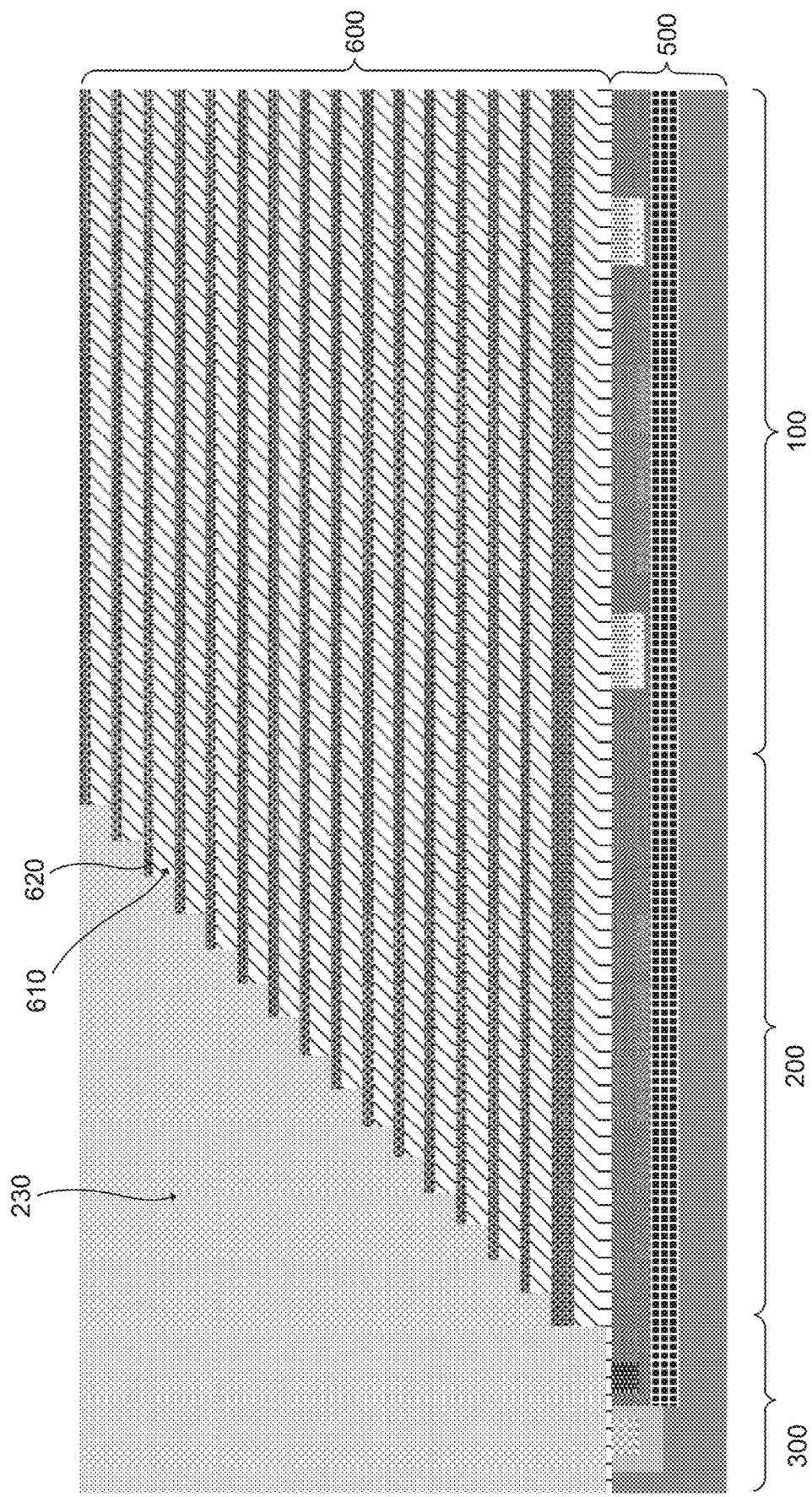

As shown in FIG. 7, an insulating layer 230 can be formed in the periphery region 300 and the staircase region 200 to cover the staircase structure 220. In some embodiments, a deposition process can be performed to form the insulating layer 234, such that the insulating layer 230 can cover the alternating dielectric stack 600 including the staircase structure 220. A CMP process can be performed to planarize the top surface of the insulating layer 230.

As shown in FIG. 2, the method proceeds to operation S210, in which multiple channel structures can be formed in the alternating dielectric stack in the core region. In some embodiments, each channel structure can include a channel hole extending vertically through the alternating dielectric stack, an epitaxial layer on a bottom of the channel hole, a functional layer on the sidewall of the channel hole, a channel layer 730 between the functional layer and a filling structure, and a channel plug on a top of the channel hole. The multiple channel structures can be arranged as an array in the alternating dielectric stack.

In some embodiments, fabrication processes to form the channel structure include forming multiple channel holes that extend vertically through the alternating dielectric stack 600 to expose the HVPW region 520 of the substrate 500. The channel hole can have a high aspect ratio, and can be formed by etching the alternating dielectric stack 600, and a subsequent cleaning process. The etching process to form the channel hole can be a wet etching, a dry etching, or a combination thereof.

In some embodiments, fabrication processes to form the channel structure include forming an epitaxial layer 710 at a bottom of the channel hole. In some embodiments, the epitaxial layer 710 can be a polycrystalline silicon (polysilicon) layer formed by using a selective epitaxial growth (SEG) process. For example, an SEG pre-clean process can be performed to clean the multiple channel holes. A following deposition process can be performed to form a polysilicon layer at the bottom of each channel hole. In some embodiments, any suitable doping process, such as an ion metal plasma (IMP) process, can be performed on the polysilicon layer to form the epitaxial layer 710.

In some embodiments, fabrication processes to form a functional layer 720 on the sidewall of the channel hole. The functional layer 720 can be a composite dielectric layer, such as a combination of a barrier layer 722, a storage layer 724, and a tunneling layer 726. The functional layer 720, including the barrier layer 722, the storage layer 724, and the tunneling layer 726, can be formed by one or more thin film deposition processes, such as ALD, CVD, PVD, any other suitable processes, or any combination thereof.

Figure 8:
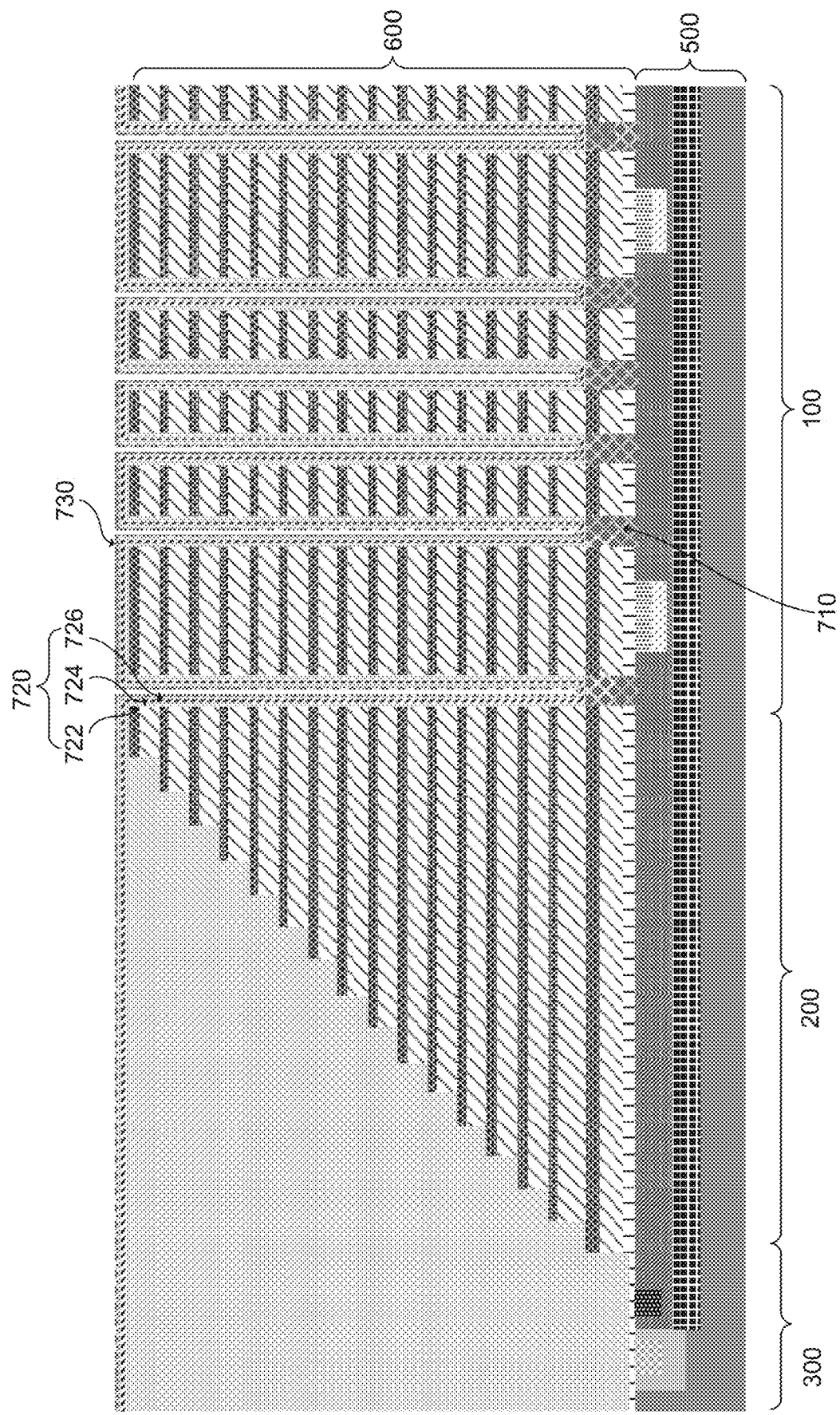

As shown in FIG. 8, the barrier layer 722 can be formed between the storage layer 724 and the sidewall of the channel hole. The barrier layer 722 can be used for blocking the outflow of the electronic charges. In some embodiments, the barrier layer 722 can be a silicon oxide layer or a combination of silicon oxide/silicon nitride/silicon oxide (ONO) layers. In some embodiments, the barrier layer 722 includes high dielectric constant (high k-value) dielectrics (e.g., aluminum oxide). In some embodiments, a thickness of the barrier layer 722 can be in a range from about 3 nm to about 20 nm.

The storage layer 724 can be formed between the tunneling layer 726 and the barrier layer 722. Electrons or holes from the channel layer can tunnel to the storage layer 724 through the tunneling layer 726. The storage layer 724 can be used for storing electronic charges (electrons or holes) for memory operation. The storage or removal of charge in the storage layer 724 can impact the on/off state and/or a conductance of the semiconductor channel. The storage layer 724 can include one or more films of materials including, but are not limited to, silicon nitride, silicon oxynitride, a combination of silicon oxide and silicon nitride, or any combination thereof. In some embodiments, the storage layer 724 can include a nitride layer formed by using one or more deposition processes. In some embodiments, a thickness of the storage layer 724 can be in a range from about 3 nm to about 20 nm.

The tunneling layer 726 can be formed on the sidewall of the storage layer 724. The tunneling layer 726 can be used for tunneling electronic charges (electrons or holes). The tunneling layer 726 can include dielectric materials including, but not limited to, silicon oxide, silicon nitride, silicon oxynitride, or any combination thereof. In some embodiments, the tunneling layer 130 can be an oxide layer formed by using a deposition process. In some embodiments, a thickness of the tunneling layer 726 can be in a range from about 3 nm to about 20 nm.

Figure 9:
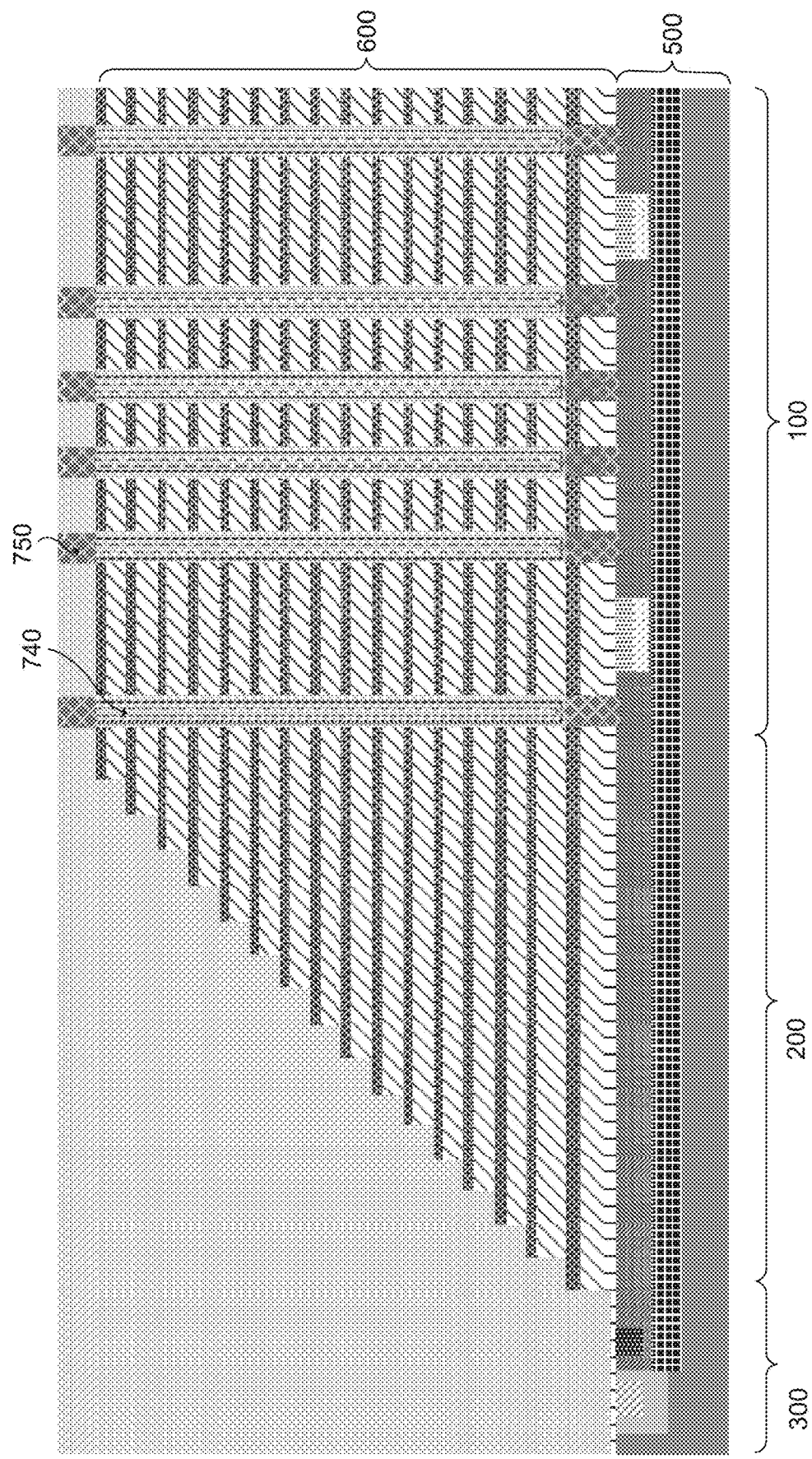
Figure 10:
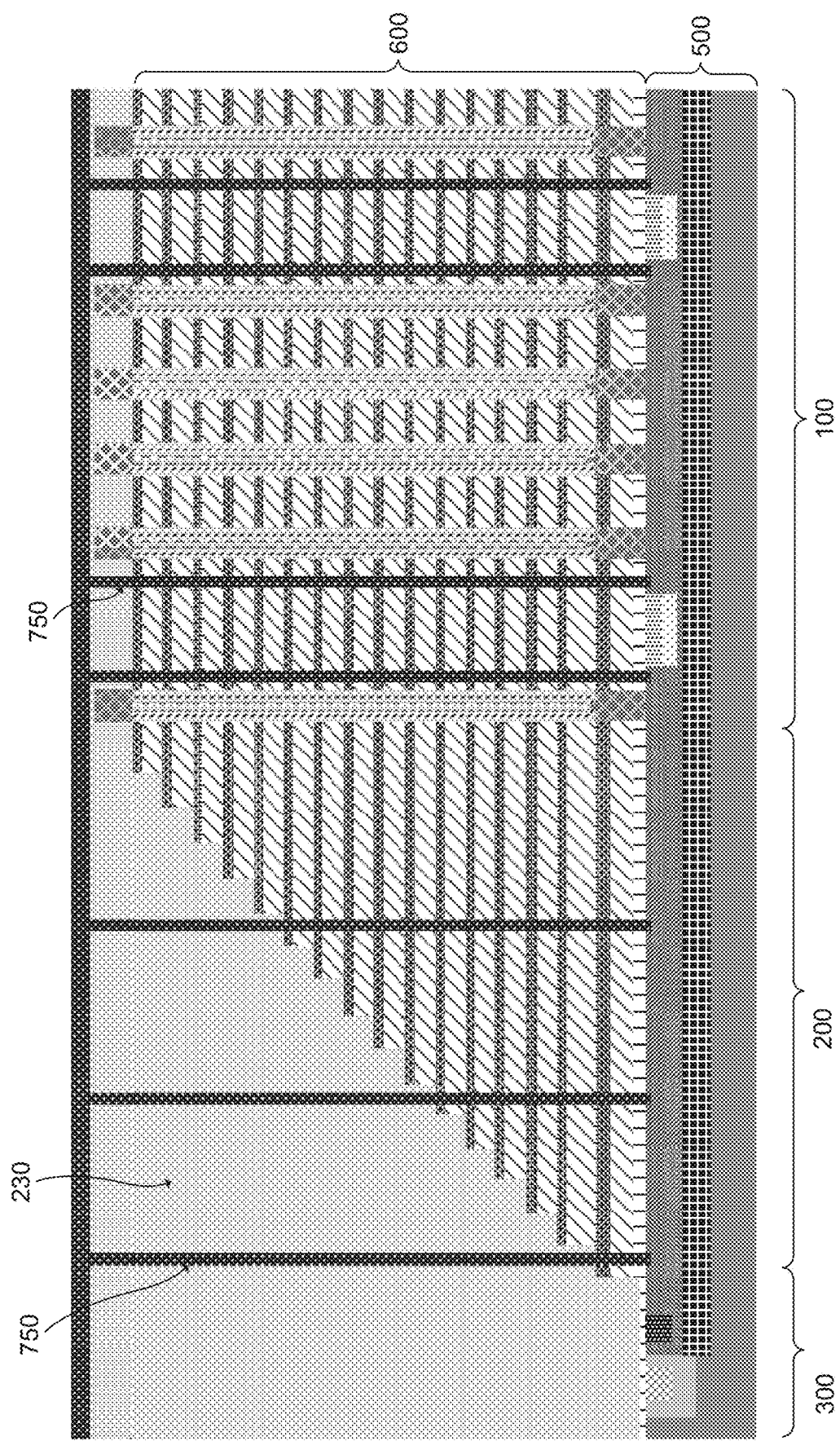

In some embodiments, fabrication processes to form the channel structure further include forming a channel layer 730 covering the sidewall of the functional layer 720, as shown in FIG. 8. In some embodiments, the channel layer 730 can be an amorphous silicon layer or a polysilicon layer formed by using a thin film deposition process, such as ALD, CVD, PVD, or any other suitable process. In some embodiments, a punch etching can be performed to remove a portion of the functional layer 720 and the channel layer 730 at the bottom of each channel hole to expose the epitaxial layer 710. And then the channel layer 730 can be connected to the epitaxial layer 710 by an additional deposition process, as shown in FIG. 9. In some embodiments, a thickness of the channel layer 730 can be in a range from about 5 nm to 20 nm.

In some embodiments, fabrication processes to form the channel structure further include forming a filling structure 740 to cover the channel layer 730 and fill the channel hole, as shown in FIG. 9. In some embodiments, the filling structure 740 can be an oxide layer formed by using any suitable deposition process, such as ALD, CVD, PVD, etc. In some embodiments, the filling structure 740 can include one or more air gaps (not shown in figures).

In some embodiments, fabrication processes to form the channel structure further include forming a channel plug 750 at a top of each channel hole, as shown in FIG. 9. The channel plug 750 can be in contact with the channel layer 730 in each channel hole. The material of the channel plugs 750 can include any suitable conductive material, such as Si, W, etc. The channel plugs 750 can be formed by using any suitable deposition process, and a following CMP process.

As shown in FIG. 2, the method proceeds to operation S212, in which multiple dummy channel structures can be formed. As show in FIG. 10, in embodiments, the dummy channel structures 120 can be formed in any suitable positions in the core array region 100, the staircase region 200 and/or the periphery region 300. In some embodiments, fabrication processes to form the dummy channel structures 120 can include etching the insulating layer 230 and/or the alternating dielectric stack 600 to form multiple dummy channel holes. The multiple dummy channel holes can penetrate the insulating layer 230 and/or the alternating dielectric stack 600, and can extend into the substrate 500. A deposition process can then be performed to fill the multiple dummy channel holes with any suitable dielectric material, such as $SiO_2$. As such, multiple dummy channel structures 120 can be formed to provide mechanical support for the 3D memory array structures.

Figure 11:
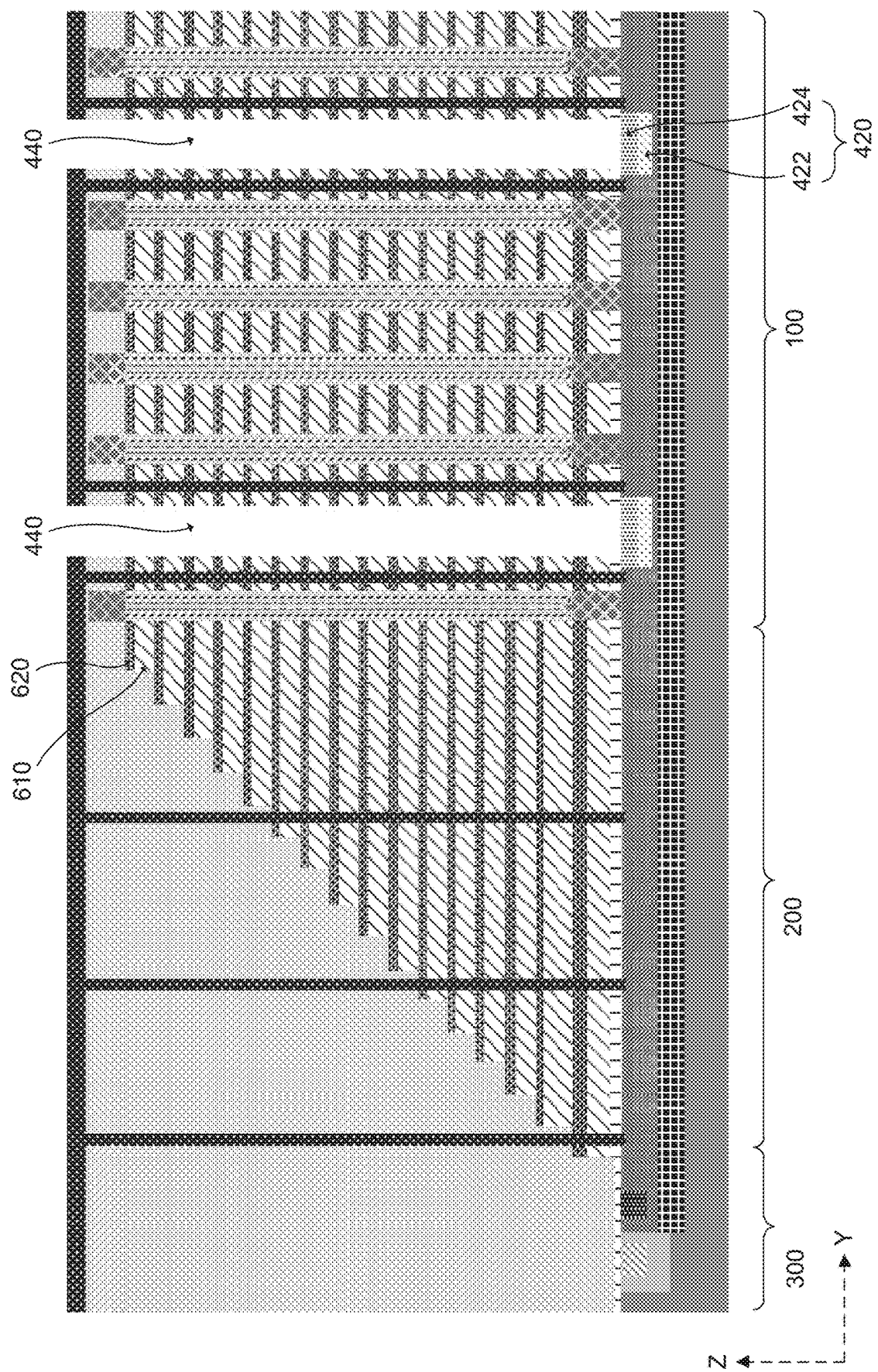

As shown in FIG. 2, the method proceeds to operation S214, in which multiple slits can be formed in the alternating dielectric stack. As shown in FIG. 11, each slit 440 can vertically penetrate through the alternating dielectric stack 600, and extend laterally in a straight line along the X direction between two arrays of channel structures. In some embodiments, each slit 440 expose a row of the hybrid STI structures 420.

The multiple slits 440 can be formed by forming a mask layer over the alternating dielectric stack 600 and patterning the mask using, e.g., photolithography, to form openings corresponding to the multiple slits in the patterned mask layer. A suitable etching process, e.g., dry etch and/or wet etch, can be performed to remove portions of the alternating dielectric stack 600 exposed by the openings until the multiple slits 440 expose the top surface of the conductive sublayer 424 of the hybrid STI structures 420. The mask layer can be removed after the formation of the multiple slits 440.

Figure 12:
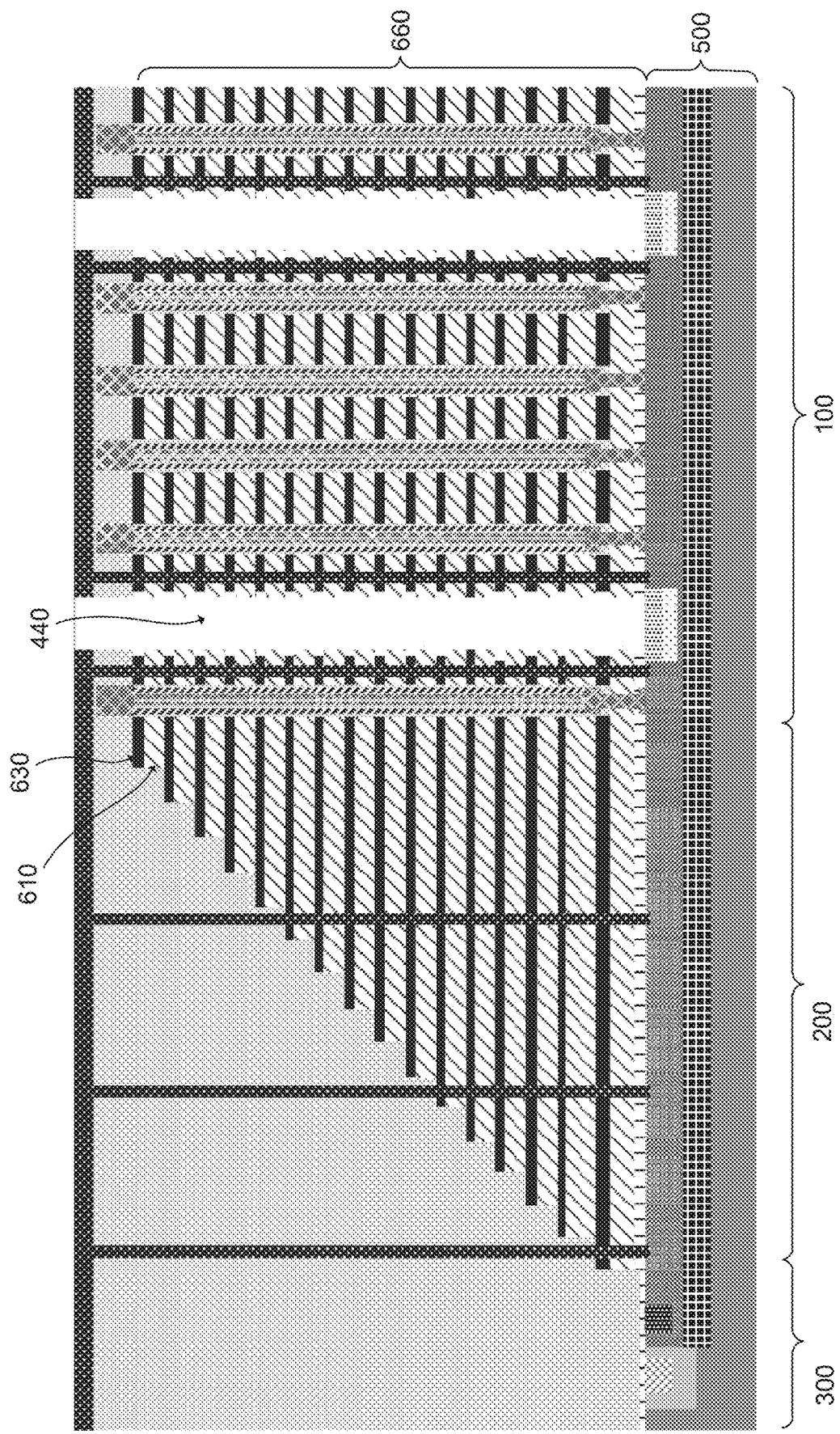

As shown in FIG. 2, the method proceeds to operation S216, in which the second dielectric layers in the alternating dielectric stack can be replaced by multiple gate structures. As shown in FIG. 12, after the replacement, the alternating dielectric stack 600 can become an alternating dielectric/conductive stack 660.

In some embodiments, operation S216 includes removing the second dielectric layers in the alternating dielectric stack 600. As described above, the second dielectric layers 620 in the alternating dielectric stack 600 are used as sacrificial layers, and are removed by used any suitable etching process, e.g., an isotropic dry etch or a wet etch. The etching process can have sufficiently high etching selectivity of the material of the second dielectric layers 620 over the materials of the first dielectric layer 610, such that the etching process can have minimal impact on the first dielectric layer 610. The isotropic dry etch and/or the wet etch can remove second dielectric layers 620 in various directions to expose the top and bottom surfaces of each first dielectric layer 610. As such, multiple horizontal trenches can then be formed between first dielectric layers. Each of the multiple horizontal trenches can extend in a horizontal direction, and can be used as a space for a gate structure to be formed in the subsequent processes. It is noted that, the term "horizontal/horizontally" used herein means nominally parallel to a lateral surface of a substrate.

In some embodiments, the second dielectric layers 620 include silicon nitride and the etchant of the isotropic dry etch includes one or more of $CF_4$, $CHF_3$, $C4F_8$, $C4F_6$, and $CH_2F_2$. The radio frequency (RF) power of the isotropic dry etch can be lower than about 100 W and the bias can be lower than about 10V. In some embodiments, the second dielectric layers 620 include silicon nitride and the etchant of the wet etch includes phosphoric acid.

After the second dielectric layers 620 are removed, the multiple slits 440 and multiple horizontal trenches can be cleaned by using any suitable cleaning process. For example, a phosphoric acid rinsing process can be performed to remove the impurities on the inner wall of the horizontal trenches. In some embodiments, a rinsing temperature can be in a range from about 100° C. to about 200° C., and a rinsing time can be in a range from about 10 minutes to about 100 minutes.

In some embodiments, multiple gate structures 630 can be formed in each horizontal trench, as shown in FIG. 12. In some embodiments, each gate structure 630 can include a gate electrode (not shown) sandwiched by an insulating film (not shown). The insulating film can be used as a gate dielectric layer for insulating the respective word line (i.e., gate electrode).

In some embodiments, the insulating film can be formed to cover the exposed surfaces of the horizontal trenches with one or more suitable insulating materials. For example, one or more suitable deposition processes, such as CVD, PVD, and/or ALD, can be utilized to deposit the one or more insulating materials into the horizontal trenches. In some embodiments, a recess etching process and/or a CMP process can be used to remove excessive insulating material(s). The one or more insulating materials can include any suitable materials that provide electric insulating function.

In some embodiments, the gate electrode can be formed in each horizontal trench. The gate electrode can be formed by filling the horizontal trenches with a suitable gate electrode metal material. The gate electrodes can provide the base material for the word lines. The gate electrode metal material can include any suitable conductive material. e.g., tungsten, aluminum, copper, cobalt, or any combination thereof, for forming the word lines. The gate electrode material can be deposited into horizontal trenches using a suitable deposition method such as CVD, PVD, plasma-enhanced CVD (PECVD), sputtering, metal-organic chemical vapor deposition (MOCVD), and/or ALD.

In some embodiments, portions of the multiple gate structures 630 can be removed by a recess etching process. In some embodiments, in order to ensure the insulation between multiple gates, a recess etching process, such as a wet etching process, can be performed to remove the exposed portions of the multiple gate structures 630. In doing so, a recess can be formed in each horizontal trench adjacent to the sidewalls of the silt 440, as shown in FIG. 12.

Figure 13:
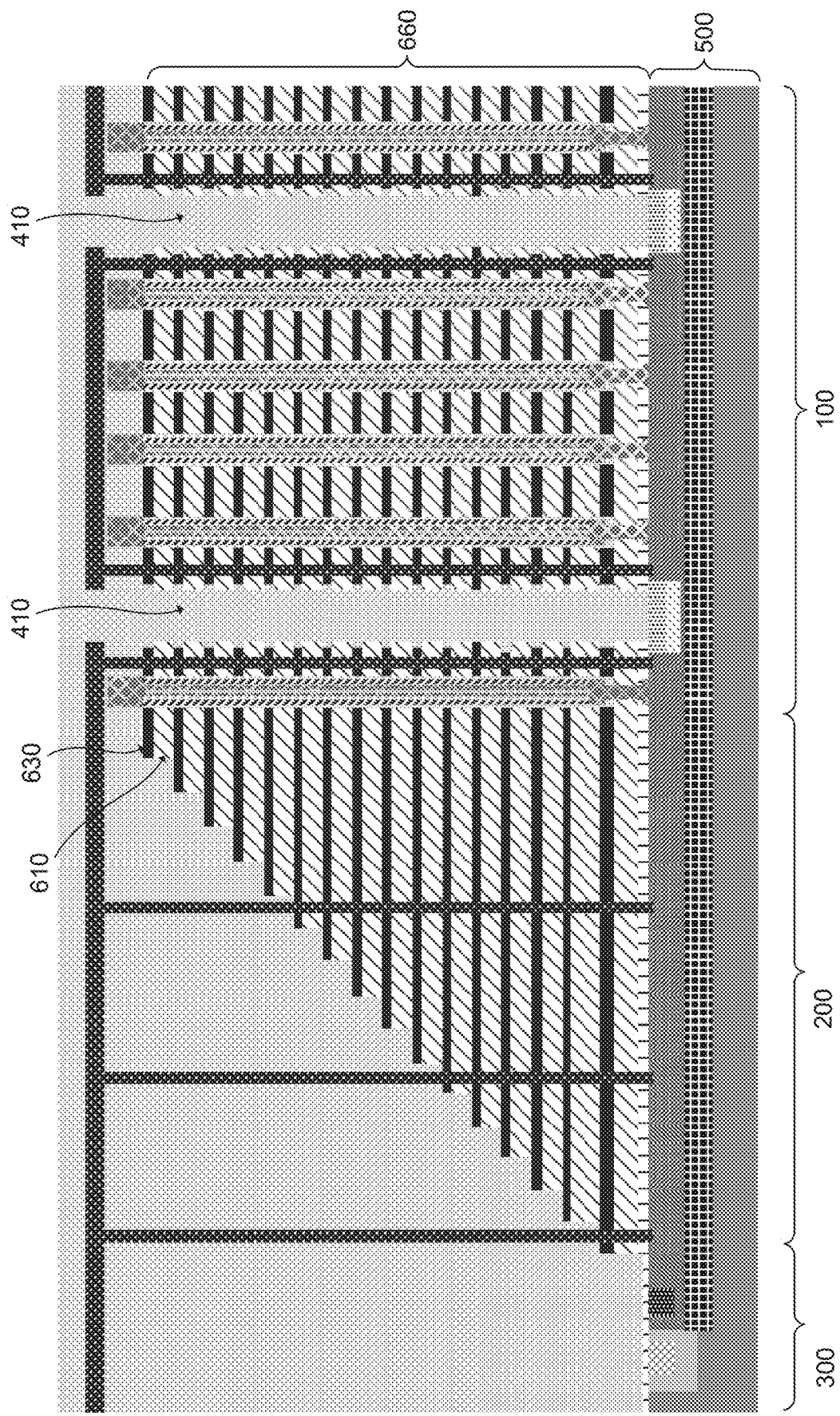

As shown in FIG. 2, the method proceeds to operation S218, in which a spacer wall can be formed to fill each of the multiple slits, as shown in FIG. 13. In some embodiments, the spacer wall 410, which is also referred as a gate line spacer (GLSP) layer, can be used to provide electrical insulation between the multiple gate structures 630 and the array common source (ACS) contacts formed in a subsequent process. In some embodiments, the spacer walls 410 can be formed by using any suitable deposition process, such as an atomic layer deposition (ALD) process to deposit a low temperature oxide material or a high temperature oxide material to fill the multiple slits 440.

As shown in FIG. 2, the method proceeds to operation S220, in which multiple array common source (ACS) contacts can be formed to each in electrical contact with a corresponding shallow trench isolation (STI) structure.

Figure 14:
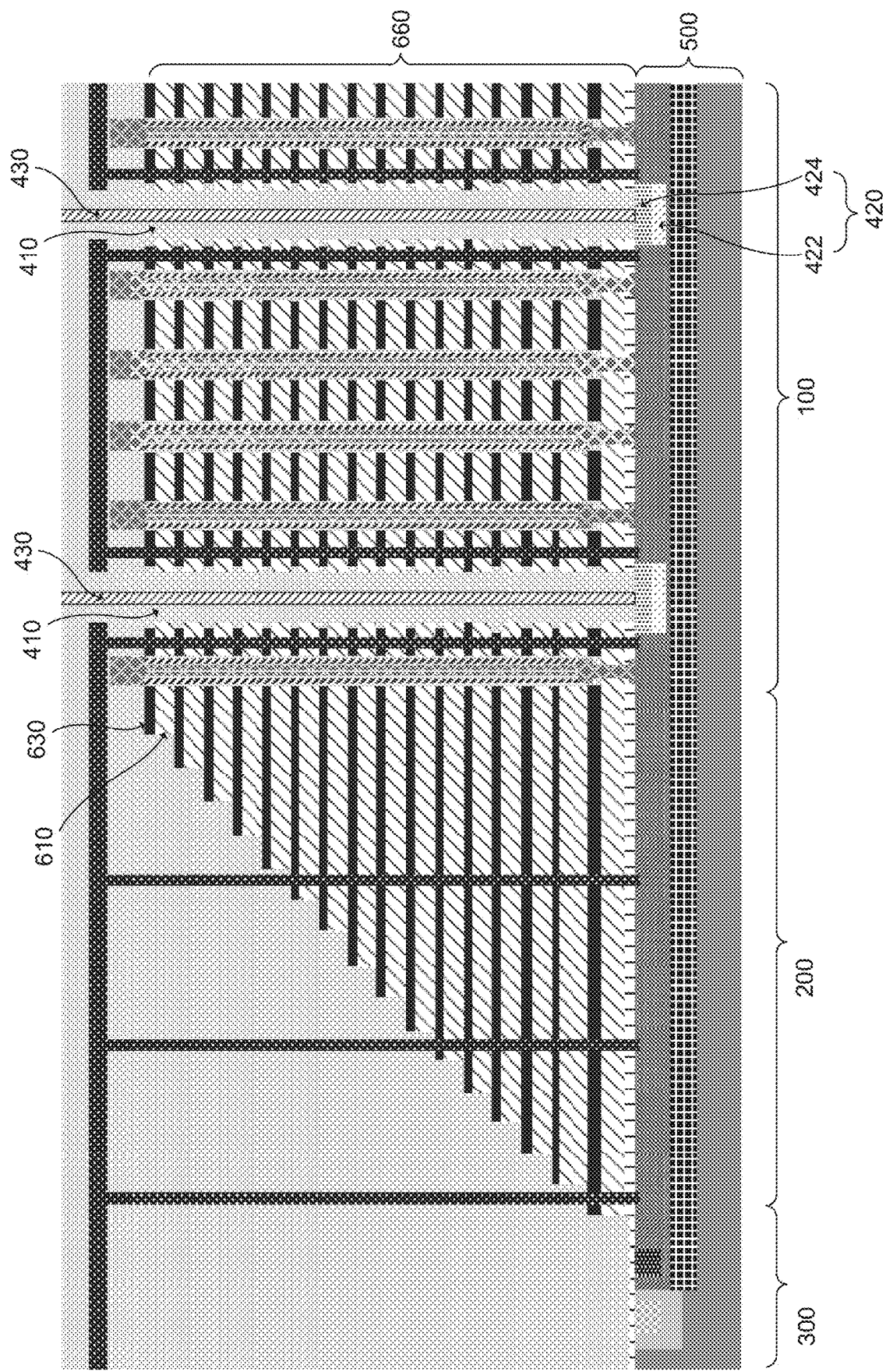

In some embodiments, as shown in FIG. 14, the multiple array common source (ACS) contacts 430 can each vertically penetrate the spacer wall 410, and be in electrical contact with the conductive sublayer 424 of the corresponding STI structure 420. A fabricating process for forming the multiple ACS contacts 430 can include performing a punch etching process to punch through the spacer walls 410 to form multiple through holes that each exposes the conductive sublayer 424 of a corresponding STI structure 420. A deposition process can then be performed to fill the multiple through holes with any suitable conductive material, such as metal materials including tungsten, aluminum, copper, polysilicon, silicides, and/or combinations thereof, etc. The conductive material can be deposited into the multiple through holes using any suitable deposition method such as CVD, PVD, PECVD, MOCVD, and/or ALD. A CMP process can be performed to planarize the top surfaces of the multiple ACS contacts 430.

Figure 15:
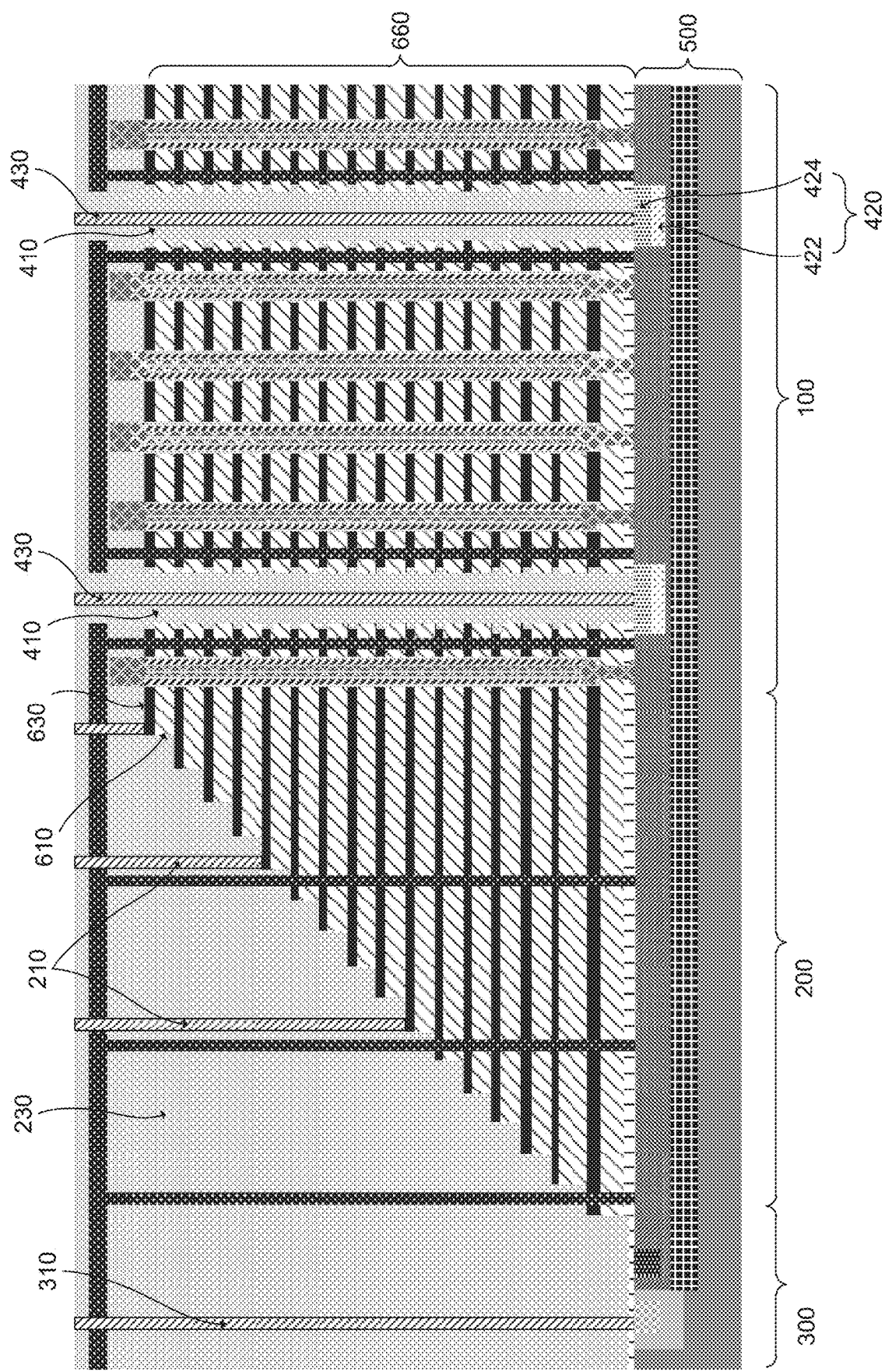

In some embodiments, as shown in FIG. 15, the multiple ACS contacts 430 can be formed in same processes with the multiple word line contacts 210 in the staircase region 200, and/or the multiple peripheral contacts 310 in the periphery region 300. That is, the through holes penetrating the spacer walls 410 and the through holes penetrating the insulating layer 230 can be formed simultaneously by a single punch etching process. And a single conductive material deposition process can be performed to simultaneously form the peripheral contacts 310 in the periphery region 300, the word line contacts 210 in the staircase region 200, and the ACS contacts 430 in the core array region 100.

Figure 16:
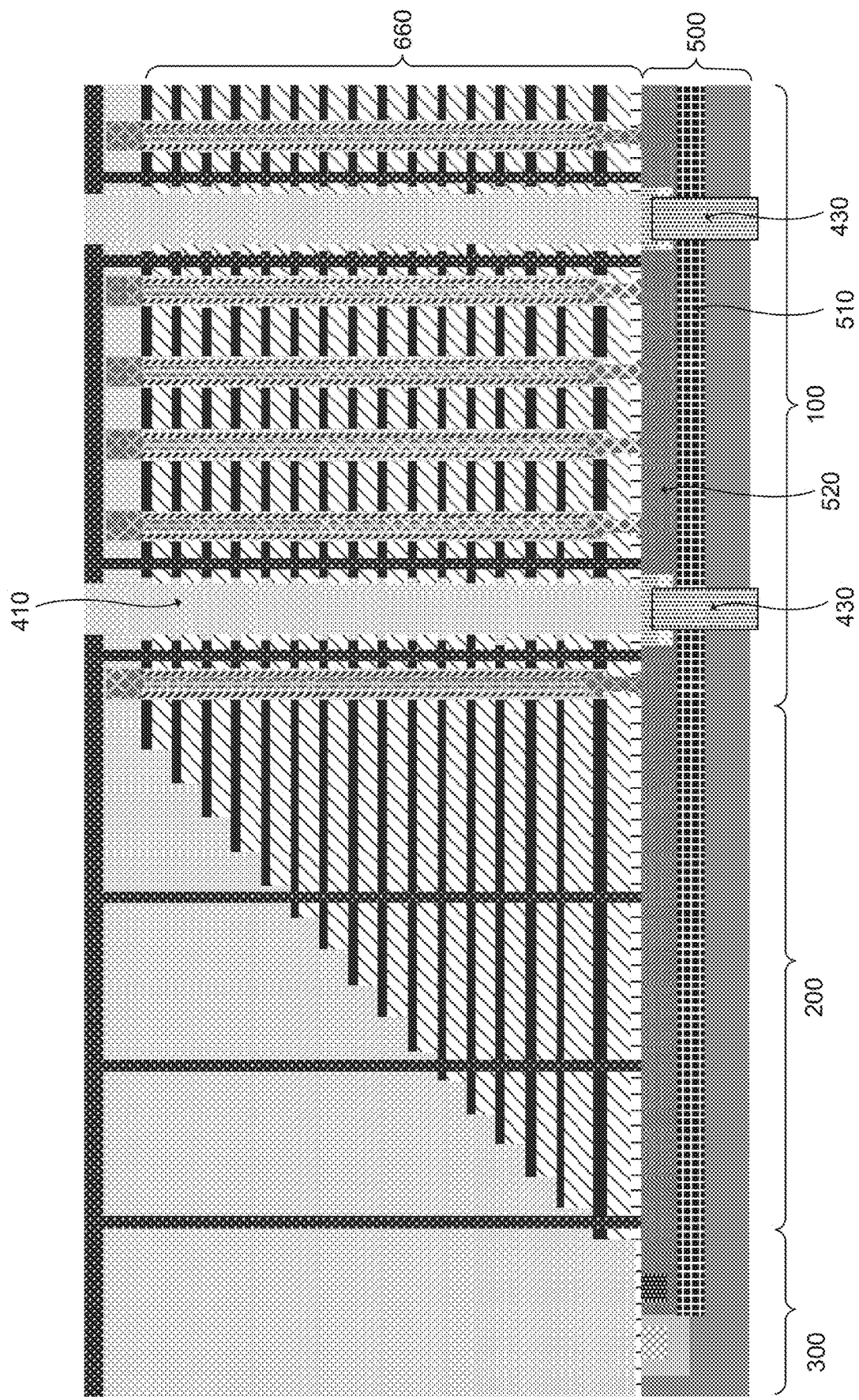

In some alternative embodiments, as shown in FIG. 16, the multiple ACS contacts 430 can be formed through the backside of the substrate 500 by a back end of line (BEOL) process. That is, after forming the multiple spacer walls 410 to completely filling the multiple slits 440, the wafer can be disposed upside down. A punch etching process can be performed to form multiple via holes that are located corresponding to the multiple STIs structure 420 in the substrate 500, and penetrate the substrate 500 and the dielectric sublayer 422 of the corresponding STI structure 420, and expose the conductive sublayer 424 of the corresponding STI structure 420. A deposition process can then be performed to fill the multiple via holes with any suitable conductive material to form the multiple ACS contacts 430. A CMP process can be performed to planarize the top surfaces of the multiple ACS contacts 430 and to thin the substrate 500.

Accordingly, a method for forming a 3D memory device is provided in some embodiments in accordance with the present disclosure. In the disclosed method, a hybrid STI structure is used to instead a heavily doped/implanted crystalline silicon region as an ACS of the NAND strings. Such design can scientifically reduce the contact resistance between the ACS and the ACS contacts. Further, the 3D memory device formed by the disclosed method can have a better control of carriers between the source and the drain.

One aspect of the present disclosure provides a method for forming a three-dimensional (3D) NAND memory device, comprising: forming a plurality of hybrid shallow trench isolation structures in a substrate; forming an alternating dielectric stack on the substrate, the alternating dielectric stack including a plurality of dielectric layer pairs each comprising a first dielectric layer and a second dielectric layer different from the first dielectric layer; forming a plurality of channel structures in the alternating dielectric stack; forming a slit penetrating vertically through the alternating dielectric stack and extending in a horizontal direction to divide the plurality of channel structures and to expose a row of hybrid shallow trench isolation structures; replacing the second dielectric layers in the alternating dielectric stack with a plurality of gate structures through the slit; forming a spacer wall to fill the slit; and forming a plurality of array common source contacts each in electric contact with a corresponding hybrid shallow trench isolation structure.

In some embodiments, forming the plurality of hybrid shallow trench isolation structures comprises forming at least one row of shallow trenches extending in the horizontal direction in the substrate; and forming the plurality of hybrid shallow trench isolation structures in the at least one row of shallow trenches.

In some embodiments, forming the plurality of hybrid shallow trench isolation structures comprises: forming a dielectric sublayer in the at least one row of shallow trenches; removing an upper portion of the dielectric sublayer; and forming a conductive sublayer on a remaining portion of the dielectric sublayer.

In some embodiments, forming the plurality of hybrid shallow trench isolation structures comprises forming the plurality of hybrid shallow trench isolation structures arranged in an array, the array including a plurality of rows of hybrid shallow trench isolation structures extending paralleling in the horizontal direction.

In some embodiments, forming the silt comprises forming a plurality of silts each expose a corresponding row of shallow trench isolation structures.

In some embodiments, forming the plurality of channel structures comprises: forming a channel hole extending vertically through the alternating dielectric stack; forming an epitaxial layer in a bottom portion of the channel hole; forming a functional layer on a sidewall of the channel hole; forming a channel layer covering a sidewall of the functional layer; forming a filling structure to fill the channel hole; and forming a channel plug in a top portion of the channel hole.

In some embodiments, forming the functional layer comprises: forming a barrier layer on a sidewall of the channel hole configured to block an outflow of electronic charges during operation; forming a storage layer on a surface of the barrier layer configured to store electronic charges during operation; and forming a tunneling layer on a surface of the storage layer configured to tunnel electronic charges during operation.

In some embodiments, forming the plurality of array common source contacts comprising: forming a plurality of through holes vertically penetrating the spacer wall, each expose the conductive sublayer of a corresponding shallow trench isolation structure; and forming the plurality of array common source contacts in the plurality of through holes respectively, each array common source contact being in electrical contact with the conductive sublayer of the corresponding shallow trench isolation structure.

In some embodiments, the method further comprises: forming a staircase structure including a plurality of staircases each comprising a conductive surface; and forming a plurality of word line contacts simultaneously with the formation of the plurality of array common source contacts, each word line contacts being in electrical contact with the conductive surface of a corresponding staircase.

In some embodiments, the method further comprises: forming a transistor of a peripheral device in the substrate; and forming a peripheral contact simultaneously with the formation of the plurality of array common source contacts, the peripheral contact being in electrical contact with the transistor.

In some embodiments, forming the plurality of array common source contacts comprises: forming a plurality of via holes each vertically penetrating the substrate and the dielectric sublayer of a corresponding shallow trench isolation structure; and forming the plurality of array common source contacts in the plurality of via holes respectively, each array common source contact being in electrical contact with the conductive sublayer of the corresponding shallow trench isolation structure.

Another aspect of the present disclosure provides a three-dimensional (3D) NAND memory device, comprising: a substrate including a plurality of hybrid shallow trench isolation structures; an alternating dielectric/conductive stack including a plurality of dielectric/conductive layer pairs on a substrate, each of the plurality of dielectric/conductive layer pairs comprising a dielectric layer and a conductive layer; a plurality of channel structures vertically penetrating the alternating dielectric/conductive stack; a slit penetrating vertically through the alternating dielectric/conductive stack and extending between the plurality of channel structures in a horizontal direction; a spacer wall in the slit; and a plurality of array common source contacts each in electric contact with a corresponding hybrid shallow trench isolation structure.

In some embodiments, each hybrid shallow trench isolation structure comprises a dielectric sublayer and a conductive sublayer; and each array common source contact is in electrical contact with the conductive sublayer of the corresponding shallow trench isolation structure.

In some embodiments, the plurality of hybrid shallow trench isolation structures are arranged in an array, the array including a plurality rows of hybrid shallow trench isolation structures extending paralleling in the horizontal direction; and the plurality of array common source contacts are arranged in the array, each array common source contact being in electric contact with a corresponding hybrid shallow trench isolation structure.

In some embodiments, the plurality of channel structures comprises: a channel hole extending vertically through the alternating dielectric/conductive stack; an epitaxial layer in a bottom portion of the channel hole a functional layer on a sidewall of the channel hole; a channel layer covering a sidewall of the functional layer; a filling structure filling the channel hole; and a channel plug in a top portion of the channel hole.

In some embodiments, the functional layer comprises: a barrier layer on a sidewall of the channel hole configured to block an outflow of electronic charges during operation; a storage layer on a surface of the barrier layer configured to store electronic charges during operation; and a tunneling layer on a surface of the storage layer configured to tunnel electronic charges during operation.

In some embodiments, the plurality of array common source contacts are vertically penetrating the spacer wall.

In some embodiments, the device further comprises: a staircase structure including a plurality of staircases each comprising a conductive surface; and a plurality of word line contacts each being in electrical contact with the conductive surface of a corresponding staircase; wherein the plurality of word line contacts and the plurality of array common source contacts are formed simultaneously in a single process.

In some embodiments, the device further comprises: a transistor of a peripheral device in the substrate; and a peripheral contact being in electrical contact with the transistor; wherein the peripheral contact and the plurality of array common source contacts are formed simultaneously in a single process.

In some embodiments, each of the plurality of array common source contacts is vertically penetrating the substrate and the dielectric sublayer of a corresponding shallow trench isolation structure.

Other aspects of the present disclosure can be understood by those skilled in the art in light of the description, the claims, and the drawings of the present disclosure.

The foregoing description of the specific embodiments will so fully reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A method for forming a three-dimensional (3D) NAND memory device, comprising:
   forming a plurality of hybrid shallow trench isolation structures in a substrate, each hybrid shallow trench isolation structure comprising a dielectric sublayer and a conductive sublayer, both of which are embedded in the substrate;
   forming an alternating dielectric stack on the substrate;
   forming a slit penetrating vertically through the alternating dielectric stack and extending in a horizontal direction to expose a row of hybrid shallow trench isolation structures; and
   forming a plurality of array common source contacts in the slit, each array common source contact being in electrical contact with a corresponding hybrid shallow trench isolation structure, wherein the forming the plurality of hybrid shallow trench isolation structures comprises:
   forming the dielectric sublayer in at least one row of shallow trenches;
   removing an upper portion of the dielectric sublayer; and
   forming the conductive sublayer on a remaining portion of the dielectric sublayer.

2. The method of claim 1, wherein forming the plurality of hybrid shallow trench isolation structures comprises:
   forming at least one row of shallow trenches extending in the horizontal direction in the substrate.

3. The method of claim 2, wherein forming the plurality of hybrid shallow trench isolation structures further comprises:
   forming the plurality of hybrid shallow trench isolation structures in the at least one row of shallow trenches.

4. The method of claim 1, further comprising:
   forming a plurality of channel structures in the alternating dielectric stack, wherein the alternating dielectric stack includes a plurality of dielectric layer pairs stacked along a vertical direction on the substrate, each dielectric layer pair comprising a first dielectric layer and a second dielectric layer different from the first dielectric layer; and
   replacing the second dielectric layers in the alternating dielectric stack with a plurality of gate structures through the slit.

5. The method of claim 1, wherein forming the plurality of hybrid shallow trench isolation structures comprises:
   forming the plurality of hybrid shallow trench isolation structures arranged in an array, the array including a plurality of rows of hybrid shallow trench isolation structures extending parallel to each other in the horizontal direction.

6. The method of claim 5, wherein forming the slit comprises:
   forming a plurality of slits that each expose a corresponding row of hybrid shallow trench isolation structures; and
   forming a spacer wall to fill each slit.

7. The method of claim 4, wherein forming the plurality of channel structures comprises:
   forming a channel hole extending vertically through the alternating dielectric stack;
   forming an epitaxial layer in a bottom portion of the channel hole;
   forming a functional layer on a sidewall of the channel hole;
   forming a channel layer covering a sidewall of the functional layer;
   forming a filling structure to fill the channel hole; and
   forming a channel plug in a top portion of the channel hole.

8. The method of claim 6, wherein forming the plurality of array common source contacts comprises:
   forming a plurality of through holes vertically penetrating the spacer wall, each exposing the conductive sublayer of a corresponding hybrid shallow trench isolation structure; and
   forming the plurality of array common source contacts in the plurality of through holes respectively, each array common source contact being in electrical contact with the conductive sublayer of the corresponding hybrid shallow trench isolation structure.

9. The method of claim 1, further comprising:
forming a staircase structure including a plurality of staircases each comprising a conductive surface; and
forming a plurality of word line contacts simultaneously with the formation of the plurality of array common source contacts, each word line contact being in electrical contact with the conductive surface of a corresponding staircase.

10. The method of claim 1, further comprising:
forming a transistor of a peripheral device in the substrate; and
forming a peripheral contact simultaneously with the formation of the plurality of array common source contacts, the peripheral contact being in electrical contact with the transistor.

11. The method of claim 1, wherein forming the plurality of array common source contacts comprises:
forming a plurality of via holes each vertically penetrating the substrate and the dielectric sublayer of a corresponding hybrid shallow trench isolation structure; and
forming the plurality of array common source contacts in the plurality of via holes respectively, each array common source contact being in electrical contact with the conductive sublayer of the corresponding hybrid shallow trench isolation structure.

12. A three-dimensional (3D) NAND memory device, comprising:
a substrate including a plurality of hybrid shallow trench isolation structures each comprising a dielectric sublayer and a conductive sublayer, both of which are embedded in the substrate, wherein the conductive sublayer is disposed on the dielectric sublayer;
an alternating dielectric/conductive stack on the substrate;
a slit penetrating vertically through the alternating dielectric/conductive stack; and
a plurality of array common source contacts in the slit, each array common source contact being in electrical contact with a corresponding hybrid shallow trench isolation structure.

13. The device of claim 12, further comprising a plurality of channel structures vertically penetrating the alternating dielectric/conductive stack, wherein the slit extends between the plurality of channel structures along a horizontal direction.

14. The device of claim 12, wherein:
the plurality of hybrid shallow trench isolation structures are arranged in an array, the array including a plurality of rows of hybrid shallow trench isolation structures extending parallel to each other in the horizontal direction; and
the plurality of array common source contacts are arranged in the array, each array common source contact being in electrical contact with a corresponding hybrid shallow trench isolation structure.

15. The device of claim 13, wherein the plurality of channel structures comprises:
a channel hole extending vertically through the alternating dielectric/conductive stack;
an epitaxial layer in a bottom portion of the channel hole;
a functional layer on a sidewall of the channel hole;
a channel layer covering a sidewall of the functional layer;
a filling structure filling the channel hole; and
a channel plug in a top portion of the channel hole.

16. The device of claim 12, wherein:
each array common source contact is in electrical contact with the conductive sublayer of the corresponding hybrid shallow trench isolation structure.

17. The device of claim 12, further comprising a spacer wall in the slit, wherein the plurality of array common source contacts are vertically penetrating the spacer wall.

18. The device of claim 12, further comprising:
a staircase structure including a plurality of staircases each comprising a conductive surface; and
a plurality of word line contacts each being in electrical contact with the conductive surface of a corresponding staircase;
wherein the plurality of word line contacts and the plurality of array common source contacts are formed simultaneously in a single process.

19. The device of claim 12, further comprising:
a transistor of a peripheral device in the substrate; and
a peripheral contact being in electrical contact with the transistor;
wherein the peripheral contact and the plurality of array common source contacts are formed simultaneously in a single process.

20. The device of claim 12, wherein each of the plurality of array common source contacts is vertically penetrating the substrate and the dielectric sublayer of the corresponding hybrid shallow trench isolation structure.

* * * * *